US008409470B2

(12) United States Patent  (10) Patent No.: US 8,409,470 B2
Hirosaki et al.  (45) Date of Patent: Apr. 2, 2013

(54) PHOSPHOR AND LIGHT-EMITTING EQUIPMENT USING PHOSPHOR

(75) Inventors: Naoto Hirosaki, Tsukuba (JP); Kyota Ueda, Yokohama (JP); Hajime Yamamoto, Hachioji (JP)

(73) Assignees: Independent Administrative Institution National Institute for Materials Science, Tsukuba-shi (JP); Mitsubishi Chemical Corporation, Tokyo (JP)

(*) Notice: Subject to any disclaimer, the term of this patent is extended or adjusted under 35 U.S.C. 154(b) by 731 days.

(21) Appl. No.: 11/441,094

(22) Filed: May 26, 2006

(65) Prior Publication Data

US 2007/0007494 A1  Jan. 11, 2007

Related U.S. Application Data

(63) Continuation-in-part of application No. PCT/JP2004/017895, filed on Nov. 25, 2004.

(30) Foreign Application Priority Data

Nov. 26, 2003 (JP) ................. 2003-394855
Feb. 18, 2004 (JP) ................. 2004-041503
May 25, 2004 (JP) ................. 2004-154548
May 28, 2004 (JP) ................. 2004-159306

(51) Int. Cl.
C09K 11/02 (2006.01)
C09K 11/08 (2006.01)
C09K 11/77 (2006.01)
C09K 11/54 (2006.01)
C09K 11/66 (2006.01)

(52) U.S. Cl. ............ 252/301.4 F; 252/301.4 R; 313/503
(58) Field of Classification Search ............ 252/301.4 F, 252/301.4 R; 313/503
See application file for complete search history.

(56) References Cited

U.S. PATENT DOCUMENTS

| | | | |
|---|---|---|---|
| 5,998,925 A | 12/1999 | Shimizu et al. | |
| 6,066,861 A | 5/2000 | Höhn et al. | |
| 6,632,379 B2 | 10/2003 | Mitomo et al. | |
| 6,670,748 B2 | 12/2003 | Ellens et al. | |
| 6,674,233 B2 | 1/2004 | Ellens et al. | |
| 6,682,663 B2 | 1/2004 | Botty et al. | |
| 6,717,355 B2 | 4/2004 | Takahashi et al. | |
| 6,724,142 B2 | 4/2004 | Ellens et al. | |
| 6,776,927 B2 | 8/2004 | Mitomo et al. | |
| 7,138,756 B2 * | 11/2006 | Gotoh et al. | 313/467 |
| 7,252,788 B2 * | 8/2007 | Nagatomi et al. | 252/301.4 F |
| 7,273,568 B2 * | 9/2007 | Nagatomi et al. | 252/301.4 F |
| 7,345,418 B2 * | 3/2008 | Nagatomi et al. | 313/503 |
| 7,432,647 B2 * | 10/2008 | Nagatomi et al. | 313/503 |
| 7,507,354 B2 | 3/2009 | Oshio | |
| 7,938,983 B2 | 5/2011 | Mueller-Mach et al. | |

| | | |
|---|---|---|
| 2002/0043926 A1 | 4/2002 | Takahashi |
| 2003/0030038 A1 | 2/2003 | Mitomo et al. |
| 2003/0030368 A1 | 2/2003 | Ellens et al. |
| 2003/0094893 A1 | 5/2003 | Ellens et al. |
| 2004/0135504 A1 | 7/2004 | Tamaki et al. |
| 2005/0189863 A1 | 9/2005 | Nagatomi et al. |
| 2006/0006782 A1 | 1/2006 | Nagatomi et al. |
| 2006/0017041 A1 | 1/2006 | Tian et al. |
| 2006/0017365 A1 | 1/2006 | Nagatomi et al. |
| 2006/0022573 A1 | 2/2006 | Gotoh et al. |
| 2006/0033083 A1 | 2/2006 | Sakane et al. |
| 2006/0038477 A1 | 2/2006 | Tamaki et al. |
| 2006/0043337 A1 | 3/2006 | Sakane et al. |
| 2006/0045832 A1 | 3/2006 | Nagatomi et al. |
| 2006/0065878 A1 | 3/2006 | Sakane et al. |
| 2006/0071589 A1 | 4/2006 | Radkov |
| 2006/0076883 A1 | 4/2006 | Himaki et al. |
| 2006/0091790 A1 | 5/2006 | Nagatomi et al. |
| 2006/0097245 A1 | 5/2006 | Aanegola et al. |
| 2006/0181192 A1 | 8/2006 | Radkov et al. |
| 2006/0192178 A1 | 8/2006 | Hirosaki |
| 2006/0197432 A1 | 9/2006 | Nagatomi et al. |
| 2006/0255710 A1 | 11/2006 | Mueller-Mach et al. |
| 2007/0029525 A1 | 2/2007 | Gotoh et al. |
| 2007/0040152 A1 | 2/2007 | Oshio |
| 2007/0108896 A1 | 5/2007 | Hirosaki |
| 2007/0159091 A1 | 7/2007 | Hirosaki et al. |
| 2007/0259206 A1 | 11/2007 | Oshio |

FOREIGN PATENT DOCUMENTS

| | | |
|---|---|---|
| DE | 101 33 352 A1 | 2/2003 |
| DE | 101 46 719 A1 | 4/2003 |
| DE | 101 47 040 A1 | 4/2003 |
| EP | 1 078 969 A1 | 2/2001 |
| EP | 1264 873 A2 | 12/2002 |
| EP | 1 278 250 A2 | 1/2003 |
| EP | 1 296 376 A2 | 3/2003 |
| EP | 1 296 383 A2 | 3/2003 |

(Continued)

OTHER PUBLICATIONS

U.S. Appl. No. 11/909,009, filed Sep. 18, 2007, Kijima, et al.

(Continued)

Primary Examiner — Carol M Koslow
Assistant Examiner — Matthew E Hoban
(74) Attorney, Agent, or Firm — Oblon, Spivak, McClelland, Maier & Neustadt, L.L.P.

(57) ABSTRACT

An object of the present invention is to provide an inorganic phosphor having fluorescence properties emitting an orange or red light which has a longer wavelength as compared with the cases of conventional sialon phosphors activated with a rare earth.

The invention relates to a design of white light-emitting diode rich in a red component and having good color-rendering properties by employing a solid solution crystal phase phosphor which uses as a host crystal an inorganic compound having the same crystal structure as that of a $CaSiAlN_3$ crystal phase and to which M (wherein M is one or two or more elements selected from the group consisting of Mn, Ce, Pr, Nd, Sm, Eu, Tb, Dy, Ho, Er, Tm, and Yb) is added as an emission center.

23 Claims, 14 Drawing Sheets

FOREIGN PATENT DOCUMENTS

| | | |
|---|---|---|
| JP | 10-93146 | 4/1998 |
| JP | 10-163535 | 6/1998 |
| JP | 2927279 | 7/1999 |
| JP | 2001-58820 | 3/2001 |
| JP | 2002-76434 | 3/2002 |
| JP | 2002-322474 | 11/2002 |
| JP | 2002-363554 | 12/2002 |
| JP | 3364229 | 1/2003 |
| JP | 2006-70088 | 3/2003 |
| JP | 2003-124527 | 4/2003 |
| JP | 2003-203504 | 7/2003 |
| JP | 2003-206481 | 7/2003 |
| JP | 2003-277746 | 10/2003 |
| JP | 2003-321675 | 11/2003 |
| JP | 2004-010786 | 1/2004 |
| JP | 2004-182780 | 7/2004 |
| JP | 2004-182781 | 7/2004 |
| JP | 2004-189996 | 7/2004 |
| JP | 2005-235934 | 9/2005 |
| JP | 2005-255895 | 9/2005 |
| JP | 2005-302920 | 10/2005 |
| JP | 2005-336253 | 12/2005 |
| JP | 2006-16413 | 1/2006 |
| JP | 2006-028295 | 2/2006 |
| JP | 2006-28295 | 2/2006 |
| JP | 2006-63286 | 3/2006 |
| JP | 2006-063286 | 3/2006 |
| JP | 2006-70109 | 3/2006 |
| JP | 2006-070109 | 3/2006 |
| JP | 2006-274265 | 10/2006 |
| KR | 2001-0021309 | 3/2001 |
| WO | WO 2005/033247 A1 | 4/2005 |
| WO | WO 2005/103199 | 11/2005 |

OTHER PUBLICATIONS

Zhen-Kun Huang, et al., "Phase relations of the $Si_3N_4$-AlN-CaO system", Journal of Materials Science Letters, 4, 1985, p. 255-259.

H.A. Hoeppe, et al. "Luminescence in Eu2+-doped Ba2Si5N8: fluorescence, thermoluminescence, and upconversion" ;Journal of Physics and Chemistry of Solids 61; 2000; pp. 2001-2006.

J.W.H. van Krevel "On new rare-earth doped M-Si-Ai-O-N. materials"; TU Eindhoven; 2000; pp. 1-173.

National Institute for Materials Science Press Release, Aug. 31, 2004, pp. 1-7, "Success in Development of Red Phosphor for White LED", with attached English translation.

The Electrochemical Society, Inc., Website Announcing 2004 Joint International Meeting, Jun. 3, 2004, with attached Abstract.

Japan Society of Applied Physics Presentation, Sep. 2, 2004, with attached English translation.

Uheda et al, 13$^{th}$ International Symposium on the Physics and Chemistry of Luminescent Materials Presentation, Oct. 3-8, 2004, "The Crystal Structure and Photoluminescence Properties of a New Red Phosphor, Calcium Aluminum Silicon Nitride doped with Divalent Europium, $CaAlSiN_3:Eu^{2+}$".

The Decision of Final Rejection of the Application issued Apr. 29, 2010, in Chinese Application No. 200480040967.7 (with English-language translation).

Official Action isssued Jul. 8, 2010, in European Appilcation No. 04 799 893.5-1218.

Office Action issued Jul. 8, 2010, in Korean Application No. 10-2010-7005847 (with English-language translation).

Office Action issued Jul. 8, 2010, in Korean Application No. 10-2009-7016000 (with English-language translation).

R Xie et al, "Preparation and Luminescence Spectra of Calcium- and Rare-Earth (R=Eu, Tb, and Pr)-Codoped α-SiAlON Ceramics", J. Am Ceram. Soc. , 85, 5, 1229-34 (2002)

Frank Ottinger et al., "New Nitridosilicates, Nitridoaluminosilicates and Sialons-Syntheses and Crystal Structures," Laboratory of Inorganic Chemistry, HCI H 106, ETH Zurich, CH-8093, Zurich, Switzerland (date unknown).

V.A. Krasnoperov et al., "Research on the Properties of Luminescent Aluminum Nitride," Proceedings of the Academy of Sciences of the USSR Physics Series, vol. XXX, No. 9, pp. 1430-1432, (1966).

S.S. Lee, et al, "Photoluminescence and Electroluminescence Characteristics of CaSiN2:Eu Phosphor", SPIE vol. 324, pp. 75-83, 0277-786X/97/S10.00 (1997).

Frank Ottinger, "Synthese, Struktur und analytische Detailstudien neuer stickstoffhaltiger Silicate und Aluminosilicate," Thesis, Zurich, (submitted 2004) (with attached computer-generated English translation).

Korean Office Action issued Feb. 28, 2011, in Korean Patent Application No. 2009-7016000, with English language translation.

Korean Office Action issued Jul. 25, 2011, in Korean Patent Application No. 2010-7005847 (with English-language Translation).

Office Action issued Oct. 13, 2012, in Korean Patent Application No. 7-7-2012-008798203, Decision No. 2012-2372, Patent No. 0816693, forwarding third-party grounds for invalidation (with partial English-language Translation).

S.F. Kuang et al., "Phase Relationships in the System MgO-Si3N4-AlN," Journal of Materials Science Letters, (9) 1990, 69-71.

* cited by examiner

PHOSPHOR AND LIGHT-EMITTING EQUIPMENT USING PHOSPHOR

FIELD OF THE INVENTION

The present invention relates to a phosphor mainly composed of an inorganic compound and applications thereof. More specifically, the applications relate to light-emitting equipments such as a lighting equipment and an image display unit as well as a pigment and an ultraviolet absorbent, which utilize a property possessed by the phosphor, i.e., a characteristic of emitting fluorescence having a long wavelength of 570 nm or longer.

BACKGROUND ART

Phosphors are used for a vacuum fluorescent display (VFD), a field emission display (FED), a plasma display panel (PDP), a cathode ray tube (CRT), a white light-emitting diode (LED), and the like. In all these applications, it is necessary to provide energy for exciting the phosphors in order to cause emission from the phosphors. The phosphors are excited by an excitation source having a high energy, such as a vacuum ultraviolet ray, an ultraviolet ray, an electron beam, or a blue light to emit a visible light. However, as a result of exposure of the phosphors to the above excitation source, there arises a problem of decrease of luminance of the phosphors and hence a phosphor exhibiting no decrease of luminance has been desired. Therefore, a sialon phosphor has been proposed as a phosphor exhibiting little decrease of luminance instead of conventional silicate phosphors, phosphate phosphors, aluminate phosphors, sulfide phosphors, and the like.

The sialon phosphor is produced by the production process outlined below. First, silicon nitride ($Si_3N_4$), aluminum nitride (AlN), calcium carbonate ($CaCO_3$), and europium oxide ($Eu_2O_3$) are mixed in a predetermined molar ratio and the mixture is held at 1700° C. for 1 hour in nitrogen at 1 atm (0.1 MPa) and is baked by a hot pressing process to produce the phosphor (e.g., cf. Patent Literature 1). The α-sialon activated with Eu obtained by the process is reported to be a phosphor which is excited by a blue light of 450 to 500 nm to emit a yellow light of 550 to 600 nm. However, in the applications of a white LED and a plasma display using an ultraviolet LED as an excitation source, phosphors emitting lights exhibiting not only yellow color but also orange color and red color have been desired. Moreover, in a white LED using a blue LED as an excitation source, phosphors emitting lights exhibiting orange color and red color have been desired in order to improve color-rendering properties.

As a phosphor emitting a light of red color, an inorganic substance ($Ba_{2-x}Eu_xSi_5N_8$: x=0.14 to 1.16) obtained by activating a $Ba_2Si_5N_8$ crystal phase with Eu has been reported in an academic literature (cf. Non-Patent Literature 1) prior to the present application. Furthermore, in Chapter 2 of a publication "On new rare-earth doped M-Si—Al—O—N materials" (cf. Non-Patent Literature 2), a phosphor using a ternary nitride of an alkali metal and silicon having various compositions, $M_xSi_yN_z$ (M=Ca, Sr, Ba, Zn; x, y, and z represent various values) as a host has been reported. Similarly, $M_xSi_yN_z$:Eu (M=Ca, Sr, Ba, Zn; z=2/3x+4/3y) has been reported in U.S. Pat. No. 6,582,663 (Patent Literature 2).

As other sialon, nitride or oxynitride phosphors, there are known in JP-A-2003-206431 (Patent Literature 3) phosphors using $MSi_3N_5$, $M_2Si_4N_7$, $M_4Si_6N_{11}$, $M_9Si_{11}N_{23}$, $M_{16}Si_{15}O_6N_{32}$, $M_{13}Si_{18}Al_{12}O_{18}N_{36}$, $MSi_5Al_2ON_9$, and $M_3Si_5AlON_{10}$ (wherein M represents Ba, Ca, Sr or a rare earth element) as host crystals, which are activated with Eu or Ce. Among them, phosphors emitting a light of red color have been also reported. Moreover, LED lighting units using these phosphors are known. Furthermore, JP-A-2002-322474 (Patent Literature 4) has reported a phosphor wherein an $Sr_2Si_5N_8$ or $SrSi_7N_{10}$ crystal phase is activated with Ce.

In JP-A-2003-321675 (Patent Literature 5), there is a description of $L_xM_yN_{(2/3x+4/3y)}$:Z (L is a divalent element such as Ca, Sr, or Ba, M is a tetravalent element such as Si or Ge, and Z is an activator such as Eu) phosphor and it describes that addition of a minute amount of Al exhibits an effect of suppressing afterglow. Moreover, a slightly reddish warm color white emitting apparatus is known, wherein the phosphor and a blue LED are combined. Furthermore, JP-A-2003-277746 (Patent Literature 6) reports phosphors constituted by various combinations of L Element, M Element, and Z Element as $L_xM_yN_{(2/3x+4/3y)}$:Z phosphors. JP-A-2004-10786 (Patent Literature 7) describes a wide range of combinations regarding an L-M-N:Eu,Z system but there is not shown an effect of improving emission properties in the cases that a specific composition or crystal phase is used as a host.

The representative phosphors in Patent Literatures 2 to 7 mentioned above contain nitrides of a divalent element and a tetravalent element as host crystals and phosphors using various different crystal phases as host crystals have been reported. The phosphors emitting a light of red color are also known but the emitting luminance of red color is not sufficient by excitation with a blue visible light. Moreover, they are chemically unstable in some compositions and thus their durability is problematic.

[Non-Patent Literature 1]
H. A. Hoppe, and other four persons, "Journal of Physics and Chemistry of Solids" 2000, vol. 61, pages 2001-2006
[Non-Patent Literature 2]
"On new rare-earth doped M-Si—Al—O—N materials" written by J. W. H. van Krevel, TU Eindhoven 2000, ISBN, 90-386-2711-4
[Patent Literature 1]
JP-A-2002-363554
[Patent Literature 2]
U.S. Pat. No. 6,682,663
[Patent Literature 3]
JP-A-2003-206481
[Patent Literature 4]
JP-A-2002-322474
[Patent Literature 5]
JP-A-2003-321675
[Patent Literature 6]
JP-A-2003-277746
[Patent Literature 7]
JP-A-2004-10786

As conventional art of lighting apparatus, a white light-emitting diode wherein a blue light-emitting diode element and a blue light-absorbing yellow light-emitting phosphor are combined is known and has been practically used in various lighting applications. Representative examples thereof include "a light-emitting diode" of Japanese Patent No. 2900928 (Patent Literature 8), "a light-emitting diode" of Japanese Patent No. 2927279 (Patent Literature 9), "a wavelength-converting molding material and a process for producing the same, and a light-emitting element" of Japanese Patent No. 3364229 (Patent Literature 10), and the like. Phosphors most frequently used in these light-emitting diode are yttrium.aluminum.garnet-based phosphors activated with cerium represented by the general formula: $(Y,Gd)_3(Al,Ga):Ce^{3+}$.

However, there is a problem that the white light-emitting diode comprising a blue light-emitting diode element and the yttrium.aluminum.garnet-based phosphor has a characteristic of emitting a bluish-white light because of an insufficient red component and hence deflection is found in color-rendering properties.

Based on such a background, there has been investigated a white light-emitting diode wherein a red component which is short in the yttrium.aluminum.garnet-based phosphor is supplemented with another red phosphor by mixing and dispersing two kinds of phosphors. As such light-emitting diodes, "a white light-emitting diode" of JP-A-10-163535 (Patent Literature 11), "a nitride phosphor and a process for producing the same" of JP-A-2003-321675 (Patent Literature 5), and the like can be exemplified. However, a problem to be improved regarding color-rendering properties still remains also in these inventions, and hence it is desired to develop a light-emitting diode where the problem is solved. The red phosphor described in JP-A-10-163535 (Patent Literature 11) contains cadmium and thus there is a problem of environmental pollution. Although red light emitting phosphors including $Ca_{1.97}Si_5N_8:Eu_{0.03}$ described in JP-A-2003-321675 (Patent Literature 5) as a representative example do not contain cadmium but further improvement of their emission intensities has been desired since luminance of the phosphor is low.

[Patent Literature 8]
Japanese Patent No. 2900928
[Patent Literature 9]
Japanese Patent No. 2927279
[Patent Literature 10]
Japanese Patent No. 3364229
[Patent Literature 11]
JP-A-10-163535

DISCLOSURE OF THE INVENTION

The invention intends to reply such demands and an object thereof is to provide an inorganic phosphor which emits an orange or red light having a longer wavelength than that of conventional sialon phosphors activated with a rare earth, has a high luminance, and is chemically stable. Furthermore, another object of the invention is to provide alighting equipment excellent in color-rendering properties, an image display unit excellent in durability, a pigment, and an ultraviolet absorbent using such a phosphor.

Under such circumstances, the present inventors have conducted precise studies on phosphors using as a host an inorganic multi-element nitride crystal phase containing trivalent E Element such as Al in addition to divalent A Element such as Ca and tetravalent D Element such as Si as main metal elements and have found that a phosphor using an inorganic crystal phase having a specific composition or a specific crystal structure as a host emits an orange or red light having a longer wavelength than that of conventional sialon phosphors activated with a rare earth and also exhibits a higher luminance than that of the red phosphors hitherto reported containing a nitride or oxynitride as a host crystal.

Namely, as a result of extensive studies on inorganic compounds mainly composed of nitrides or oxynitrides containing M Element which becomes a light-emitting ion (wherein M Element is one or two or more elements selected from Mn, Ce, Pr, Nd, Sm, Eu, Tb, Dy, Ho, Er, Tm, and Yb) and divalent A Element (wherein A Element is one or two or more elements selected from Mg, Ca, Sr, and Ba), tetravalent D Element (wherein D Element is one or two or more elements selected from Si, Ge, Sn, Ti, Zr, and Hf), trivalent E Element (wherein E Element is one or two or more elements selected from B, Al, Ga, In, Sc, Y, La, Gd and Lu), and X Element (wherein X Element is one or two or more elements selected from O, N, and F), they have found that those having a specific composition region range and a specific crystal phase form phosphors emitting an orange light having a wavelength of 570 nm or longer or a red light having a wavelength of 600 nm or longer.

Furthermore, they have found that, among the above compositions, a solid solution crystal phase containing an inorganic compound having the same crystal structure as that of the $CaAlSiN_3$ crystal phase as a host crystal and incorporated with an optically active element M, particularly Eu as an emission center forms a phosphor emitting an orange or red light having an especially high luminance. Furthermore, they have found that a white light-emitting diode which has a high emission efficiency, is rich in a red component, and exhibits good color-rendering properties can be obtained by using the phosphor.

The host crystal of the phosphor of the invention achieves red-light emission exhibiting an unprecedented luminance by using the multi-element nitride wherein a trivalent element including Al as a representative is used as a main constitutive metal element, quite unlike the ternary nitrides containing divalent and tetravalent elements hitherto reported including $L_xM_yN_{(2/3x+4/3y)}$ as a representative. Moreover, the invention is a novel phosphor using a crystal phase having a composition and crystal structure quite different from the sialons such as $M_{13}Si_{18}Al_{12}O_{18}N_{36}$, $MSi_5Al_2ON_9$, and $M_3Si_5AlON_{10}$ (wherein M represents Ca, Ba, Sr, or the like) hitherto reported in Patent Literature 3 and the like and $Ca_{1.47}Eu_{0.03}Si_9Al_3N_{16}$ described in Chapter 11 of Non-Patent Literature 2 as a host. Furthermore, unlike the crystal phase containing Al in an amount of about: several hundreds of ppm described in Patent Literature 5, it is a phosphor using as a host a crystal phase wherein a trivalent element including Al as a representative is a main constitutive element of the host crystal.

In general, a phosphor wherein an inorganic host crystal is activated with Mn or a rare earth metal as an emission center element M changes an emitting color and luminance depending on an electron state around M Element. For example, in a phosphor containing divalent Eu as the emission center, light emission of blue color, green color, yellow color, or red color has been reported by changing the host crystal. Namely, even in the case that the composition is resemble, when the crystal structure of the host or the atom position in the crystal structure to which M is incorporated is changed, the emitting color and luminance become quite different and thus the resulting phosphor is regarded as a different one. In the invention, a multi-element nitride containing divalent-trivalent-tetravalent elements different from conventional ternary nitrides containing divalent and tetravalent elements is used as a host crystal and furthermore, a crystal phase having a crystal structure quite different from that of the sialon composition hitherto reported is used as a host. Thus, the phosphor having such a crystal phase as a host has not hitherto been reported. In addition, the phosphor containing the composition and crystal structure of the invention as a host exhibits a red light emission having luminance higher than that of those containing a conventional crystal structure as a host.

The above $CaAlSiN_3$ crystal phase itself is a nitride whose formation in the process of baking an $Si_3N_4$—AlN—CaO based raw material is confirmed by ZHEN-KUN-HUANG et al. for the purpose of aiming at a heat-resistant material. A process of the formation and a mechanism of the formation are precisely reported in an academic literature (c.f. Non-Patent Literature 3), which has been published prior to the present application.

[Non-Patent Literature 3]
ZHEN-KUN-HUANG and other two persons, "Journal of Materials Science Letters" 1985, vol. 4, pages 255-259

As mentioned above, the CaAlSiN$_3$ crystal phase itself is confirmed in the progress of the study of sialons. Also, from the circumstances, the content: of the report described in the above literature only mentions heat-resistant properties and the literature does not describe any matter that an optically active element may be dissolved in the crystal phase and the dissolved crystal phase may be used as a phosphor. Moreover, over the period from that time to the present invention, there is no investigation to use it as a phosphor. Namely, the important findings that a substance obtained by dissolving an optically active element in CaAlSiN$_3$ crystal phase is a novel substance and it is usable as a phosphor capable of being excited with an ultraviolet ray and a visible light and exhibiting an orange or red light emission having a high luminance have been first found by the present inventors. As a result of further extensive studies based on the findings, the inventors have succeeded in providing a phosphor showing an emission phenomenon with a high luminance in a specific wavelength region by the constitutions described in the following (1) to (24). Moreover, they have also succeeded in providing a lighting equipment and an image display unit having excellent characteristics by the constitutions described in the following (25) to (37) by using the phosphor. Furthermore, by applying the inorganic compound as the phosphor to the constitutions described in the following (38) to (39), they have also succeeded in providing a pigment and an ultraviolet absorbent. Namely, as a result of a series of experiments and studies based on the above findings, the invention has succeeded in providing a phosphor emitting a light with a high luminance in a long wavelength region as well as a lighting equipment, an image display unit, a pigment, and an ultraviolet absorbent utilizing the phosphor. The constitutions are as described in the following (1) to (39).

(1) A phosphor comprising an inorganic compound which is a composition containing at least M Element, A Element, D Element, E Element, and X Element (wherein M Element is one or two or more elements selected from the group consisting of Mn, Ce, Pr, Nd, Sm, Eu, Tb, Dy, Ho, Er, Tm, and Yb, A Element is one or two or more elements selected from the group consisting of divalent metal elements other than M Element, D Element is one or two or more elements selected from the group consisting of tetravalent metal elements, E Element is one or two or more elements selected from the group consisting of trivalent metal elements, and X Element is one or two or more elements selected from the group consisting of O, N, and F).

(2) The phosphor according to the above item (1), wherein the inorganic compound has the same crystal structure as that of CaAlSiN$_3$.

(3) The phosphor according to the above item (1) or (2), wherein the inorganic compound is represented by the composition formula $M_a A_b D_c E_d X_e$ (wherein a+b=1 and M Element is one or two or more elements selected from the group consisting of Mn, Ce, Pr, Nd, Sm, Eu, Tb, Dy, Ho, Er, Tm, and Yb, A Element is one or two or more elements selected from the group consisting of divalent metal elements other than M Element, D Element is one or two or more elements selected from the group consisting of tetravalent metal elements, E Element is one or two or more elements selected from the group consisting of trivalent metal elements, and X Element is one or two or more elements selected from the group consisting of O, N, and F), wherein the parameters a, c, d, and e satisfy all the requirements:

$$0.00001 \leq a \leq 0.1 \quad (i),$$
$$0.5 \leq c \leq 4 \quad (ii),$$
$$0.5 \leq d \leq 8 \quad (iii),$$
$$0.8 \times (2/3 + 4/3 \times c + d) \leq e \quad (iv),$$
and
$$e \leq 1.2 \times (2/3 + 4/3 \times c + d) \quad (v).$$

(4) The phosphor according to the above item (3), wherein the parameters c and d satisfy the requirements of $0.5 \leq c \leq 1.8$ and $0.5 \leq d \leq 1.8$.

(5) The phosphor according to the above item (3) or (4), wherein the parameters c, d, and e are c=d=1 and e=3.

(6) The phosphor according to any one of the above items (1) to (5), wherein A Element is one or two or more elements selected from the group consisting of Mg, Ca, Sr, and Ba, D Element is one or two or more elements selected from the group consisting of Si, Ge, Sn, Ti, Zr, and Hf, and E Element is one or two or more elements selected from the group consisting of B, Al, Ga, In, Sc, Y, La, Gd, and Lu.

(7) The phosphor according to any one of the above items (1) to (6), which contains, at least, Eu in M Element, Ca in A Element, Si in D Element, Al in E Element, and N in X Element.

(8) The phosphor according to any one of the above items (1) to (7), wherein the inorganic compound is a CaAlSiN$_3$ crystal phase or a solid solution of a CaAlSiN$_3$ crystal phase.

(9) The phosphor according to any one of the above items (1) to (8), wherein M Element is Eu, A Element is Ca, D Element is Si, E Element is Al, and X Element is N or a mixture of N and O.

(10) The phosphor according to any one of the above items (1) to (9), which contains, at least, Sr in A Element.

(11) The phosphor according to the above item (10), wherein numbers of atoms of Ca and Sr contained in the inorganic compound satisfy 0.02 (number of atoms of Ca)/{(number of atoms of Ca)+(number of atoms of Sr)}<1.

(12) The phosphor according to any one of the above items (1) to (11), which contains, at least, N and O in X.

(13) The phosphor according to the above item (12), wherein numbers of atoms of O and N contained in the inorganic compound satisfy $0.5 \leq$(number of atoms of N)/{(number of atoms of N)+(number of atoms of O)}$\leq 1$.

(14) The phosphor according to the above item (12) or (13), wherein the inorganic compound is represented by $M_a A_b D_{1-x} E_{1+x} N_{3-x} O_x$ (wherein a+b=1 and $0 < x \leq 0.5$).

(15) The phosphor according to any one of the above items (1) to (14), wherein the inorganic compound is a powder having an average particle size of 0.1 μm to 20 μm and the powder is single crystal particles or an aggregate of single crystals.

(16) The phosphor according to any one of the above items (1) to (15), wherein total of impurity elements of Fe, Co, and Ni contained in the inorganic compound is 500 ppm or less.

(17) A phosphor which is constituted by a mixture of the phosphor comprising the inorganic compound according to anyone of the above items (1) to (16) and other crystal phase or an amorphous phase and wherein the content of the phosphor comprising the inorganic compound according to any one of the above items (1) to (16) is 20% by weight or more.

(18) The phosphor according to the above item (17), wherein the other crystal phase or amorphous phase is an inorganic substance having electroconductivity.

(19) The phosphor according to the above item (18), wherein the inorganic substance having electroconductivity is an oxide, oxynitride, or nitride containing one or two or more elements selected from the group consisting of Zn, Al, Ga, In, and Sn, or a mixture thereof.

(20) The phosphor according to the above item (17), wherein the other crystal phase or amorphous phase is an inorganic phosphor different from the phosphor according to any one of the above items (1) to (16).

(21) The phosphor according to any one of the above items (1) to (20), which emits a fluorescent light having a peak in the range of a wavelength of 570 nm to 700 nm by irradiation with an excitation source.

(22) The phosphor according to the above item (21), wherein the excitation source is an ultraviolet ray or a visible light having a wavelength of 100 nm to 600 nm.

(23) The phosphor according to the above item (21), wherein the inorganic compound is a $CaAlSiN_3$ crystal phase and Eu is dissolved in the crystal phase, and which emits a fluorescent light having a wavelength of 600 nm to 700 nm when irradiated with a light of 100 nm to 600 nm.

(24) The phosphor according to the above item (21), wherein the excitation source is an electron beam or an X-ray.

(25) The phosphor according to any one of the above items (21) to (24), wherein a color emitted at the irradiation with an excitation source satisfies a requirement: 0.45×0.7 as a value of (x, y) on the CIE chromaticity coordinates.

(26) A lighting equipment constituted by a light-emitting source and a phosphor, wherein at least the phosphor according to any one of the above items (1) to (25) is used.

(27) The lighting equipment according to the above item (26), wherein the light-emitting source is an LED emitting a light having a wavelength of 330 nm to 500 nm.

(28) The lighting equipment according to the above item (26) or (27), wherein the light-emitting source is an LED emitting a light having a wavelength of 330 nm to 420 nm and which emits a white light with mixing red, green, and blue lights by using the phosphor according to anyone of the above items (1) to (25), a blue phosphor having an emission peak at a wavelength of 420 nm to 500 nm with an excitation light of 330 nm to 420 nm, and a green phosphor having an emission peak at a wavelength of 500 nm to 570 nm with an excitation light of 330 nm to 420 nm.

(29) The lighting equipment according to the above item (26) or (27), wherein the light-emitting source is an LED emitting a light having a wavelength of 420 nm to 500 nm and which emits a white light by using the phosphor according to any one of the above items (1) to (25) and a green phosphor having an emission peak at a wavelength of 500 nm to 570 nm with an excitation light of 420 nm to 500 nm.

(30) The lighting equipment according to the above item (26) or (27), wherein the emitting source is an LED emitting a light having a wavelength of 420 nm to 500 nm and which emits a white light by using a phosphor according to any one of the above items (1) to (25) and a yellow phosphor having an emission peak at a wavelength of 550 nm to 600 nm with an excitation light of 420 nm to 500 nm.

(31) The lighting equipment according to the above item (30), wherein the yellow phosphor is a Ca-αsialon in which Eu is dissolved.

(32) An image display unit constituted by an excitation source and a phosphor, wherein at least the phosphor according to any one of the above items (1) to (25) is used.

(33) The image display unit according to the above item (32), wherein the excitation source is an LED emitting a light having a wavelength of 330 nm to 500 nm.

(34) The image display unit according to the above item (32) or (33), wherein the excitation source is an LED emitting a light having a wavelength of 330 nm to 420 nm and emits a white light with mixing red, green, and blue lights by using the phosphor according to any one of the above items (1) to (25), a blue phosphor having an emission peak at a wavelength of 420 nm to 500 nm with an excitation light of 330 nm to 420 nm, and a green phosphor having an emission peak at a wavelength of 500 nm to 570 nm with an excitation light of 330 nm to 420 nm.

(35) The image display unit according to the above item (32) or (33), wherein the emitting source is an LED emitting a light having a wavelength of 420 nm to 500 nm and which emits a white light by using the phosphor according to any one of the above items (1) to (25) and a green phosphor having an emission peak at a wavelength of 500 nm to 570 nm with an excitation light of 420 nm to 500 nm.

(36) The image display unit according to the above item (32) or (33), wherein the emitting source is an LED emitting a light having a wavelength of 420 nm to 500 nm and which emits a white light by using the phosphor according to any one of the above items (1) to (25) and a yellow phosphor having an emission peak at a wavelength of 550 nm to 600 nm with an excitation light of 420 nm to 500 nm.

(37) The image display unit according to the above item (36), wherein the yellow phosphor is a Ca-αsialon in which Eu is dissolved.

(38) The image display unit according to the above items (32) to (37), wherein the image display unit is any of a vacuum fluorescent display (VFD), a field emission display (FED), a plasma display panel (PDP), and a cathode-ray tube (CRT).

(39) A pigment comprising the inorganic compound according to any one of the above items (1) to (25).

(40) An ultraviolet absorbent comprising the inorganic compound according to any one of the above items (1) to (25).

The phosphor of the invention contains a multi-element nitride containing a divalent element, a trivalent element, and a tetravalent element, particularly a crystal phase represented by $CaAlSiN_3$, another crystal phase having the same crystal structure as it, or a solid solution of these crystal phases as a main component and thereby exhibits light emission at a longer wavelength than that in the cases of conventional sialon and oxynitride phosphors, so that the phosphor of the invention is excellent as an orange or red phosphor. Even when exposed to an excitation source, the phosphor does not exhibit decrease of luminance and thus provides a useful phosphor which is suitably employed in VFD, FED, PDP, CRT, white LED, and the like. Moreover, among the phosphors, since the host of a specific inorganic compound has a red color and the compound absorbs an ultraviolet ray, it is suitable as a red pigment and an ultraviolet absorbent.

BRIEF DESCRIPTION OF THE DRAWINGS

FIGS. 1-2 is an X-ray diffraction chart of $CaAlSiN_3$ activated with Eu (Example 1).

FIG. 2 is a drawing illustrating a crystal structure model of $CaAlSiN_3$.

Figure 1:
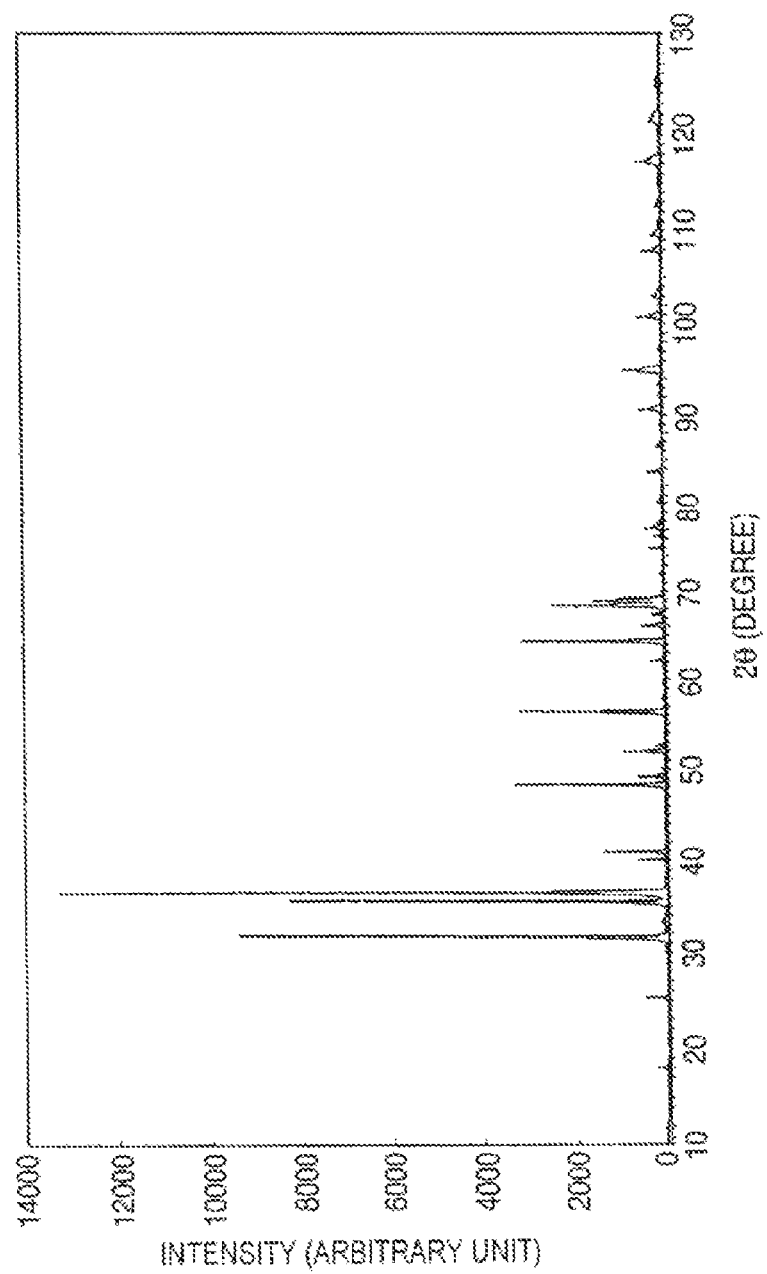
FIGS. 1-1 is an X-ray diffraction chart of $CaAlSiN_3$.

In this connection, with regard to the symbols in the figures, 1 represents a mixture of a red phosphor of the invention and a yellow phosphor or a mixture of a red phosphor of the invention, a blue phosphor, and a green phosphor, 2 represents an LED chip, 3 and 4 represent electroconductive terminals, 5 represents a wire bond, 6 represents a resin layer, 7 represents a container, 8 represents a red phosphor of the invention, 9 represents a green phosphor, 10 represents a blue phosphor, 11, 12, and 13 represent ultraviolet ray-emitting cells, 14, 15, 16, and 17 represent electrodes, 18 and 19 represent dielectric layers, 20 represents a protective layer, and 21 and 22 represent glass substrates.

BEST MODE FOR CARRYING OUT THE INVENTION

The following will describe the present invention in detail with reference to Examples of the invention.

The phosphor of the invention comprises an inorganic compound which is (1) a composition containing at least M Element, A Element, D Element, E Element, and X Element (wherein M Element is one or two or more elements selected from the group consisting of Mn, Ce, Pr, Nd, Sm, Eu, Tb, Dy, Ho, Er, Tm, and Yb, A Element is one or two or more elements selected from the group consisting of divalent metal elements other than M Element, D Element is one or two or more elements selected from the group consisting of tetravalent metal elements, E Element is one or two or more elements selected from the group consisting of trivalent metal elements, and X Element is one or two or more elements selected from the group consisting of O, N, and F) and is (2) (a) a crystal phase represented by the chemical formula $CaAlSiN_3$, (b) another crystal phase having the same crystal structure as that of the crystal phase, or (c) a solid solution of these crystal phases (hereinafter, these crystal phases are collectively referred to as "a $CaAlSiN_3$ family crystal phase"). Such a phosphor of the invention shows a particularly high luminance.

M Element is one or two or more elements selected from the group consisting of Mn, Ce, Pr, Nd, Sm, Eu, Tb, Dy, Ho, Er, Tm, and Yb. M Element is preferably one or two or more elements selected from the group consisting of Mn, Ce, Sm, Eu, Tb, Dy, Er, and Yb. M Element more preferably contains Eu and is still more preferably Eu.

A Element is one or two or more elements selected from the group consisting of divalent metal elements other than M Element. Particularly, A Element is preferably one or two or more elements selected from the group consisting of Mg, Ca, Sr, and Ba and is more preferably Ca.

D Element is one or two or more elements selected from the group consisting of tetravalent metal elements. Particularly, D Element is preferably one or two or more elements selected from the group consisting of Si, Ge, Sn, Ti, Zr, and Hf and is more preferably Si.

E Element is one or two or more elements selected from the group consisting of trivalent metal elements. Particularly, E Element is one or two or more elements selected from the group consisting of B, Al, Ga, In, Sc, Y, La, Gd, and Lu and is more preferably Al.

X Element is one or two or more elements selected from the group consisting of O, N, and F. Particularly, X Element is preferably composed of N or N and O.

The composition is represented by the composition formula $M_a A_b D_c E_d X_e$. A composition formula is a ratio of numbers of the atoms constituting the substance and one obtained by multiplying a, b, c, d, and e by an arbitrary number has also the same composition. Therefore, in the invention, the following requirements are determined to the one obtained by recalculation for a, b, c, d, and e so as to be a+b=1.

In the invention, the values of a, c, d, and e are selected from the values satisfying all the following requirements:

$$0.00001 \leq a \leq 0.1 \quad \text{(i)},$$

$$0.5 \leq c \leq 4 \quad \text{(ii)},$$

$$0.5 \leq d \leq 8 \quad \text{(iii)},$$

$$0.8 \times (2/3 + 4/3 \times c + d) \leq e \quad \text{(iv)},$$

$$e \leq 1.2 \times (2/3 + 4/3 \times c + d) \quad \text{(v)}.$$

a represents an adding amount of M Element which becomes an emission center and the ratio a of numbers of atoms M and (M+A) (wherein a=M/(M+A)) in a phosphor is suitably from 0.00001 to 0.1. When a Value is less than 0.00001, the number of M becoming an emmision center is small and hence emission luminance decreases. When a Value is larger than 0.1, concentration quenching occurs owing to interference between M ions, so that luminance decreases.

In particular, in the case that M is Eu, a Value is preferably from 0.002 to 0.03 owing to high emission luminance.

c Value is the content of D Element such as Si and is an amount represented by $0.5 \leq c \leq 4$. The value is preferably $0.5 \leq c \leq 1.8$, more preferably c=1. When c Value is less than 0.5 and when the value is larger than 4, emission luminance decreases. In the range of $0.5 \leq c \leq 1.8$, emission luminance is high and particularly, emission luminance is especially high at c=1. The reason therefor is that the ratio of formation of the $CaAlSiN_3$ family crystal phase to be described below increases.

d Value is the content of E Element such as Al and is an amount represented by $0.5 \leq d \leq 8$ The value is preferably $0.5 \leq d \leq 1.8$, more preferably d=1. When d Value is less than 0.5 and when the value is larger than 8, emission luminance decreases. In the range of $0.5 \leq d \leq 1.8$, emission luminance is high and particularly, emission luminance is especially high at d=1. The reason therefor is that the ratio of formation of the $CaAlSiN_3$ family crystal phase to be described below increases.

e Value is the content of X Element such as N and is an amount represented by from $0.8 \times (2/3 + 4/3 \times c + d)$ to $1.2 \times (2/3 + 4/3 \times c + d)$. More preferably, e=3. The reason therefor is that the ratio of formation of the $CaAlSiN_3$ family crystal phase to be described below increases. When e Value is out of the range, emission luminance decreases.

Among the above compositions, compositions exhibiting a high emission luminance are those which contain, at least, Eu in M Element, Ca in A Element, Si in D Element, Al in E Element, and N in X Element. In particular, the composition are those wherein M Element is Eu, A Element is Ca, D Element is Si, E Element is Al, and X Element is N or a mixture of N and O.

The above $CaAlSiN_3$ crystal phase is an orthorhombic system and is a substance characterized by a crystal phase having lattice constants of a=9.8007(4) Å, b=5.6497(2) Å, and c=5.0627(2) Å and having indices of crystal plane described in the chart of FIGS. 1-1 and Table 4 in X-ray diffraction.

According to the crystal structure analysis of the $CaAlSiN_3$ crystal phase conducted by the inventors, the present crystal phase belongs to $Cmc2_1$ (36th space group of International Tables for Crystallography) and occupies an atomic coordinate position shown in Table 5. In this connection, the space group is determined by convergent beam electron diffraction and the atomic coordinate is determined by Rietveld analysis of X-ray diffraction results.

Figures 1, 2:
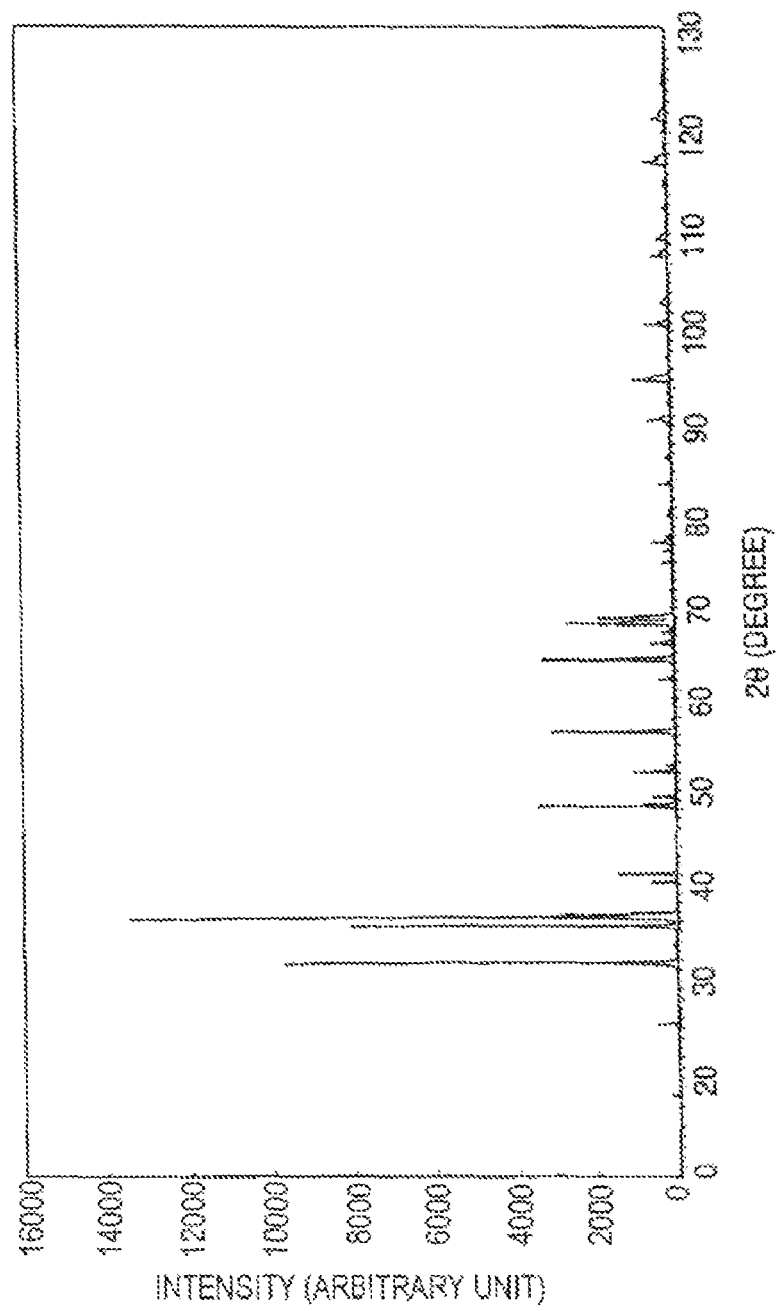
Figure 2:
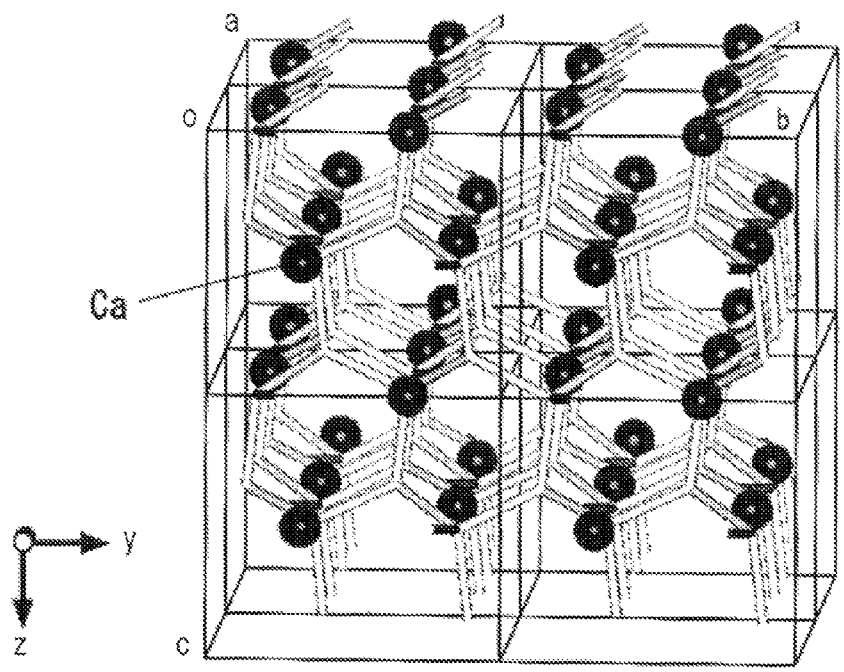
Figure 3:
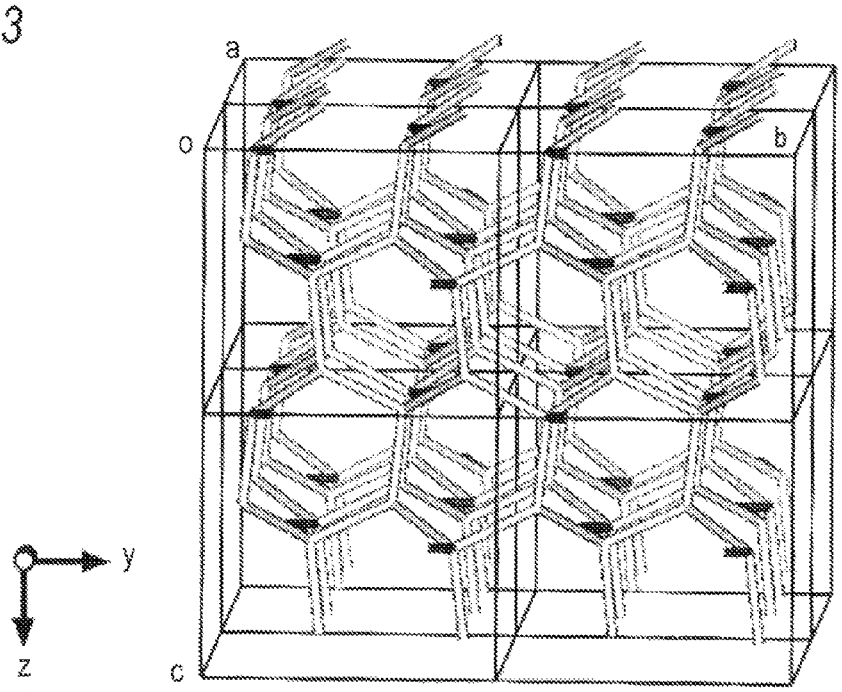
FIG. 3 is a drawing illustrating a crystal structure model of $Si_2N_2O$ having a similar structure to the $CaAlSiN_3$ crystal phase.

The crystal phase has a structure shown in FIG. 2 and has a similar skeleton to the $Si_2N_2O$ crystal phase (mineral name: sinoite) shown in FIG. 3. Namely, the crystal phase is a crystal phase wherein the position of Si in the $Si_2N_2O$ crystal phase is occupied by Si and Al and the positions of N and O are occupied by N, and Ca is incorporated as an interstitial element into a space of the skeleton formed by Si—N—O, and has a structure where the atomic coordinates are changed to the positions shown in Table 5 with the replacement of the elements. Si and Al occupy the Si position in the $Si_2N_2O$ crystal phase in an irregularly distributed (disordered) state. Thus, this structure is named as a sinoite-type sialon structure.

The inorganic compound having the same crystal structure as $CaAlSiN_3$ shown in the invention means the inorganic compound which is a $CaAlSiN_3$ family crystal phase mentioned above. The inorganic compound having the same crystal structure as $CaAlSiN_3$ includes those having lattice constants changed by the replacement of the constitutive element(s) with other element(s) in addition to the substances showing the same diffraction as the results of X-ray diffraction of $CaAlSiN_3$. For example, a $CaAlSiN_3$ crystal phase, a solid solution of the $CaAlSiN_3$ crystal phase, and the like may be mentioned. Herein, one wherein the constitutive element (s) are replaced with other element (s) means a crystal phase wherein, in the case of the $CaAlSiN_3$ crystal phase, for example, Ca in the crystal phase is replaced with M Element (wherein M Element is one or two or more elements selected from the group consisting of Mn, Ce, Pr, Nd, Sm, Eu, Tb, Dy, Ho, Er, Tm, and Yb) and/or M Element and one or two or more elements selected from the group consisting of divalent metal elements other than Ca, preferably the group consisting of Mg, Sr, and Ba, Si is replaced with one or two or more elements selected from the group consisting of tetravalent metal elements other than Si, preferably the group consisting of Ge, Sn, Ti, Zr, and Hf, Al is replaced with one or two or more elements selected from the group consisting of trivalent metal elements other than Al, preferably the group consisting of B, Ga, In, Sc, Y, La, Gd, and Lu, and N is replaced with one or two or more elements selected from the group consisting of O and F. In this connection, the $CaAlSiN_3$ family crystal phase of the invention can be identified by X-ray diffraction or neutron-ray diffraction.

The $CaAlSiN_3$ family crystal phase is changed in lattice constants by the replacement of Ca, Si, Al, or N as the constitutive components with other element(s) or the dissolution of a metal element such as Eu but the atomic position determined by the crystal structure, the site occupied by the atom, and its coordinate is changed to not so large extent that the chemical bond between skeletal atoms is cleaved. In the invention, in the case that the lengths of chemical bonds of Al—N and Si—N (distance between adjacent atoms) calculated from the lattice constants and atomic coordinates determined by Rietveld analysis of the results of X-ray diffraction and neutron-ray diffraction with the space group of $Cmc2_1$ are within ±15% as compared with the length of the chemical bond calculated from the lattice constants and atomic coordinates of $CaAlSiN_3$ shown in Table 5, it is defined that the crystal phase has the same crystal structure. In this manner, a crystal phase is judged whether it is a $CaAlSiN_3$ family crystal phase or not. This judging standard is based on the fact that, when the length of the chemical bond changes beyond ±15%, the chemical bond is cleaved and another crystal phase is formed.

Furthermore, when the dissolved amount is small, the following method may be a convenient judging method of a $CaAlSiN_3$ family crystal phase. When the lattice constants calculated from the results of X-ray diffraction measured on a new substance and the peak position (2θ) of diffraction calculated using the indices of crystal plane in Table 4 are coincident with regard to main peaks, the crystal structures can be identified to be the same. As the main peaks, it is appropriate to conduct the judgment on about ten peaks exhibiting strong diffraction intensity. In that sense, Table 4 is a standard for identifying the $CaAlSiN_3$ family crystal phase and thus is of importance. Moreover, with regard to the crystal structure of the $CaAlSiN_3$ crystal phase, an approximate structure can be defined also using another crystal system such as a monoclinic system or a hexagonal system. In that case, the expression may be one using different space group, lattice constants, and indices of crystal plane but the results of X-ray diffraction are not changed and the identification method and identification results using the same are identical thereto. Therefore, in the invention, X-ray diffraction is analyzed as an orthorhombic system. The identification method of substances based on Table 4 will be specifically described in Example 1 to be described below and only a schematic explanation is conducted here.

A phosphor is obtained by activating a $CaAlSiN_3$ family crystal phase with M Element (wherein M Element is one or two or more elements selected from the group consisting of Mn, Ce, Pr, Nd, Sm, Eu, Tb, Dy, Ho, Er, Tm, and Yb). The phosphor having a particularly high luminance among the $CaAlSiN_3$ family crystal phases is a phosphor containing as a host a $CaAlSiN_3$ crystal phase using a combination that A is Ca, D is Si, E is Al, and X is N.

A phosphor using $Ca_xSr_{1-x}AlSiN_3$ (wherein $0.02 \leq x \leq 1$) crystal phase which is a crystal phase obtained by replacing part of Ca with Sr or its solid solution as host crystals, i.e., a phosphor wherein numbers of atoms of Ca and Sr contained in the inorganic compound satisfy $0.02 \leq$(number of atoms of Ca)/{(number of atoms of Ca)+(number of atoms of Sr)}<1, becomes a phosphor exhibiting a shorter wavelength than that of the phosphor using as a host a $CaAlSiN_3$ crystal phase having a composition of the range.

The phosphor using as a host an inorganic compound containing nitrogen and oxygen is excellent in durability in a high-temperature air. In this case, durability at a high temperature is particularly excellent at the composition where numbers of atoms of O and N contained in the inorganic compound satisfy $0.5 \leq$(number of atoms of N)/{(number of atoms of N)+(number of atoms of O)}1.

In the case that the inorganic compound containing nitrogen and oxygen is used as a host, since the ratio of formation of the $CaAlSiN_3$ family crystal phase increases at the composition represented by $M_aA_1,D_{1-x}E_{1+x}N_{3-x}O_x$ (wherein a+b=1 and $0<x \leq 0.5$), emission luminance is high. This is because trivalent N is replaced with divalent O by the number of the atom the same as the number of the tetravalent D Element replaced with trivalent E Element in the composition and hence charge neutrality is maintained, so that a stable $CaAlSiN_3$ family crystal phase is formed.

In the case that the phosphor comprising the inorganic compound having the same crystal structure as $CaAlSiN_3$ of the invention is used as a powder, the average particle size of the inorganic compound is preferably from 0.1 μm to 20 μm in view of dispersibility into the resin and fluidity of the powder. Moreover, the powder is single crystal particles or an aggregate of single crystals but emission luminance is further improved by using single crystal particles having an average particle size of 0.1 μM to 20 μm.

In order to obtain a phosphor exhibiting a high emission luminance, the amount of impurities contained in the inorganic compound is preferably as small as possible. In particular, since the contamination of a large amount of Fe, Co, and Ni impurity elements inhibits light emission, it is suitable that raw powders are selected and the synthetic steps are controlled so that the total of these elements becomes not more than 500 ppm.

In the invention, from the viewpoint of fluorescence emission, it is desirable that the nitride contain the $CaAlSiN_3$ family crystal phase as a constitutive component of the nitride in high purity and as much as possible, and is possibly composed of a single phase, but it may be composed of a mixture thereof with the other crystal phases or an amorphous phase within the range where the characteristics do not decrease. In this case, it is desirable that the content of the $CaAlSiN_3$ family crystal phase is 50% by weight or more in order to obtain a high luminance. Further preferably, when the content is 20% by weight or more, luminance is remarkably improved. In the invention, the range as a main component is a content of the $CaAlSiN_3$ family crystal phase of at least 20% by weight or more. The ratio of content of the $CaAlSiN_3$ family crystal phase can be determined from the ratio of the intensity of the strongest peaks in respective phases of the $CaAlSiN_3$ family crystal phase and the other crystal phases through the measurement of X-ray diffraction.

In the case that the phosphor of the invention is used for applications excited with an electron beam, electroconductivity can be imparted to the phosphor by mixing it with an inorganic substance having electroconductivity. As the inorganic substance having electroconductivity, there may be mentioned oxides, oxynitrides, or nitrides containing one or two or more elements selected from the group consisting of Zn, Al, Ga, In, and Sn, or mixtures thereof.

The phosphor of the invention can emit a red light by the combination of a specific host crystal and an activating element but, in the case that mixing with the other colors such as yellow color, green color, and blue color is necessary, it is possible to mix inorganic phosphors emitting lights of these colors according to necessity.

The phosphors of the invention exhibit different excitation spectra and fluorescent spectra depending on the composition and hence can be set at those having various emission spectra by suitably selecting and combining them. The embodiment maybe appropriately set at a required spectrum based on the application. Particularly, one wherein Eu is added to the $CaAlSiN_3$ crystal phase in a composition of $0.0001 \leq$ (number of atoms of Eu)/{(number of atoms of Eu)+(number of atoms of Ca)} $\leq 0.1$ exhibits emission of a light having a peak in the range of a wavelength of 600 nm to 700 nm when excited with a light having a wavelength in the range of 100 nm to 600 nm, preferably 200 nm to 600 nm, and exhibits excellent emission characteristics as red fluorescence.

The phosphors of the invention obtained as above are characterized in that they have a wide excitation range of from an electron beam or an X-ray and an ultraviolet ray to a visible light, i.e., ultraviolet rays or visible lights having wavelengths from 100 nm to 600 nm, emit an orange to red light of 570 nm or longer, and particularly exhibit red color of 600 nm to 700 nm at a specific composition, and they exhibit a red light ranging $0.45 \leq x \leq 0.7$ in terms of the value of (x, y) on CIE chromaticity coordinates, as compared with conventional oxide phosphors and existing sialon phosphors. Owing to the above emission characteristics, they are suitable for a lighting equipment, an image display unit, a pigment, and an ultraviolet absorbent. In addition, since they are not degraded even when exposed to a high temperature, they are excellent in heat resistance and also excellent in long-term stability under an oxidizing atmosphere and under a moist environment.

The phosphors of the invention do not limit the production process but a phosphor exhibiting a high luminance can be produced by the following process.

A high-luminance phosphor is obtained by baking a raw material mixture, which is a mixture of metal compounds and may constitute a composition represented by M, A, D, E, and X by baking the mixture, at a temperature range of 1200° C. to 2200° C. in an inert atmosphere containing nitrogen.

In the case of synthesizing $CaAlSiN_3$ activated with Eu, it is suitable to use a powder mixture of europium nitride or europium oxide, calcium nitride, silicon nitride, and aluminum nitride as a starting material.

Moreover, in the case of synthesizing a composition containing strontium, incorporation of strontium nitride in addition to the above affords a stable $(Ca, Sr)AlSiN_3$ crystal phase wherein part of the calcium atoms in the crystal phase is replaced with strontium, whereby a high-luminance phosphor is obtained.

In the case of synthesizing a phosphor using as a host $CaAlSi(O, N)_3$ and activated with Eu, wherein part of the nitrogen atom in the crystal phase is replaced with oxygen, a starting material of a mixture of europium nitride, calcium nitride, silicon nitride, and aluminum nitride is preferable in the composition of a small oxygen content since the material has a high reactivity and the synthesis in high yields is possible. In this case, as oxygen, oxygen impurity contained in the raw material powders of europium nitride, calcium nitride, silicon nitride, and aluminum nitride is used.

In the case of synthesizing a phosphor of a large oxygen content using $CaAlSi(O, N)_3$ activated with Eu as a host, when a mixture of either of europium nitride or europium oxide or a mixture thereof, anyone of calcium nitride, calcium oxide, or calcium carbonate or a mixture thereof, silicon nitride, and aluminum nitride or a mixture of aluminum nitride and aluminum oxide is used as a starting material, the material has a high reactivity and the synthesis in high yields is possible.

It is appropriate that the above mixed powder of the metal compounds is baked in a state that a volume filling rate is maintained to 40% or less. In this connection, the volume filling rate can be determined according to (bulk density of mixed powder)/(theoretical density of mixed powder)×100 [%]. As a vessel, a boron nitride sintered article is suitable because of low reactivity with the metal compounds.

The reason why the powder is baked in a state that a volume filling rate is maintained to 40% or less is that baking in the state that a free space is present around the starting powder enables synthesis of a crystal phase having little surface defect since the $CaAlSiN_3$ family crystal phase as a reaction product grows in a free space and hence the contact of the crystal phases themselves decreases.

Next, a phosphor is synthesized by baking the resulting mixture of the metal compounds in a temperature range of 1200° C. to 2200° C. in an inert atmosphere containing nitrogen. Since the baking is conducted at a high temperature and the baking atmosphere is an inert atmosphere containing nitrogen, the furnace for use in the baking is a metal-resistor resistive heating type one or a graphite resistive heating type one and an electric furnace using carbon as a material for a high-temperature part of the furnace is suitable. As the method of the baking, a sintering method of applying no mechanical pressure externally, such as an atmospheric sintering method or a gas pressure sintering method is preferred since baking is conducted while the volume filling rate is maintained at 40% or less.

In the case that the powder aggregate obtained by the baking is strongly adhered, it is pulverized by means of a pulverizing machine usually used industrially, such as a ball mill or a jet mill and the like. The pulverization is conducted until the average particle size reaches 20 μm or less. Particularly preferred is an average particle size of 0.1 μm to 5 μm. When the average particle size exceeds 20 μm, fluidity of the powder and dispersibility thereof into resins become worse and emission intensity becomes uneven from part to part at the time when an emission apparatus is formed in combination with a light-emitting element. When the size becomes 0.1 μm or less, the amount of defects on the surface of a phosphor powder becomes large and hence emission intensity decreases in some phosphor compositions.

Of the phosphors of the invention, the phosphors using the inorganic compound containing nitrogen and oxygen as a host can be also produced by the following process.

It is a process wherein oxygen is allowed to exist in the raw material to be baked so that the ratio (percentage) of mol number of oxygen to total mol number of nitrogen and oxygen in the raw material to be baked (hereinafter referred to as an "oxygen existing ratio in a raw material") becomes from 1% to 20% in a state of a bulk density of 0.05 g/cm$^3$ to 1 g/cm$^3$ at a baking temperature of 1200° C. to 1750° C. at the time when a starting mixed powder containing an elementary substance and/or compound of M Element, a nitride of A Element, a nitride of D Element, and a nitride of E Element is baked.

The oxygen existing ratio in a raw material means a ratio (percentage) of mol number of oxygen to total mol number of nitrogen and oxygen in the raw material to be baked at baking and the nitrogen in the raw material to be baked is nitrogen derived from the raw powder, while the oxygen includes oxygen to be incorporated from the baking atmosphere into the material to be baked at baking in addition to the oxygen contained in the raw powder beforehand. The oxygen existing ratio in a raw material can be determined by the measurement using an oxygen nitrogen analyzer. The oxygen existing ratio in a raw material is preferably from 2% to 15%.

The method of allowing oxygen to exist in such an oxygen existing ratio in a raw material at baking includes:

(1) a method of using raw nitrides containing a desired concentration of oxygen as raw materials to be baked, (2) a method of allowing raw nitrides to contain a desired concentration of oxygen by heating the raw nitrides beforehand under an oxygen-containing atmosphere, (3) a method of mixing a raw nitride powder with an oxygen-containing compound powder to form a raw material to be baked, (4) a method of introducing oxygen into the raw material to be baked by contaminating oxygen in the baking atmosphere at baking of raw nitrides and oxidizing the raw nitrides at baking, and the like. In order to produce a high-luminance phosphor industrially stably, preferred is (1) the method of using raw nitrides containing a desired concentration of oxygen as raw materials to be baked or (3) the method of mixing a raw nitride powder with an oxygen-containing compound powder to form a raw material to be baked. In particular, more preferred is a method of using raw nitrides containing a desired concentration of oxygen as raw materials to be baked and also mixing the raw nitride powder with an oxygen-containing compound powder to form a raw material to be used, which is a combination of the above methods (1) and (3).

In this case, the oxygen-containing compound powder is selected from substances which form metal oxides at baking. As these substances, use can be made of oxides, inorganic acid salts such as nitrates, sulfates, and carbonates of respective metals, i.e., metals constituting the raw nitrides, organic acid salts such as oxalates and acetates thereof, oxygen-containing organometallic compounds, and the like, of respective metals, i.e., metals constituting the raw nitrides. However, from the viewpoints that oxygen concentration is easily controlled and association of impurity gases into the baking atmosphere can be suppressed at a low level, it is preferred to use metal oxides.

The oxygen existing ratio in raw material can be easily determined by conducting chemical analysis of all the raw materials. In particular, the ratio of nitrogen to oxygen can be determined by analyzing concentrations of nitrogen and oxygen.

The elementary substance and/or compound of M Element to be used as a raw material may be any substance as far as M Element is incorporated into a host crystal of the phosphor at a high temperature, including metals (elementary substances), oxides, nitrides, sulfides, halides, hydrides of M Element and also inorganic acid salts such as nitrates, sulfates, and carbonates, organic acid salts such as oxalates and acetates, organometallic compounds, and the like, and there is no limitation in its kind. However, from the viewpoint of good reactivity with other nitride materials, metals, oxides, nitrides, and halides of M Element are preferred and oxides are particularly preferred since the raw materials are available at a low cost and the temperature for phosphor synthesis can be lowered.

In the case of using at least Eu as M Element, use can be made of one or two or more of Eu metal containing Eu as a constitutive element, europium oxide such as EuO and $Eu_2O_3$, and various compounds such as EuN, $EuH_3$, $Eu_2S_3$, $EuF_2$, $EuF_3$, $EuCl_2$, $EuCl_3$, Eu $(NO_3)_3$, $Eu_2 (SO_4)_3$, $Eu_2 (CO_3)_3$, EU $(C_2O_4)_3$, EU $(O-i-C_3H_7)_3$, but Eu halides such as $EuF_2$, $EuF_3$, $EuCl_2$, and $EuCl_3$ are preferred since they have an effect of accelerating crystal growth. Moreover, $Eu_2O_3$ and Eu metal are also preferred since a phosphor having excellent characteristics can be synthesized from them. Of these, $Eu_2O_3$ is particularly preferred, which is cheap in a raw material cost, has little deliquescency, and enables synthesis of a high-luminance phosphor at a relatively low temperature.

As raw materials for elements other than M Element, i.e., raw materials for A, D, and E Elements, nitrides thereof are usually used. Examples of nitrides of A Element include one or two or more of $Mg_3N_2$, $Ca_3N_2$, $Sr_3N_2$, $Ba_3N_2$, $Zn_3N_2$, and the like, examples of nitrides of D Element include one or two or more of $Si_3N_4$, $Ge_3N_4$, $Sn_3N_4$, $Ti_3N_4$, $Zr_3N_4$, $Hf_3N_4$, and the like, and examples of nitrides of E Element include one or two or more of AlN, GaN, InN, ScN, and the like. The use of powders thereof is preferred since a phosphor having excellent emission characteristics can be produced.

In particular, the use, as raw materials of A Element, of a highly active and highly reactive nitride material having mol number of oxygen of 1% to 20% relative to the total mol number of nitrogen and oxygen remarkably accelerates the solid phase reaction between the raw mixed powder of nitrides and, as a result, it becomes possible to lower the baking temperature and atmosphere gas pressure at baking without subjecting the raw mixed powder to compression molding. For the same reason, it is preferred to use, as a raw material of A Element, a nitride material particularly having mol number of oxygen of 2% to 15% relative to the total mol number of nitrogen and oxygen.

When the bulk density of the raw mixed powder is too small, the solid phase reaction is difficult to proceed owing to small contact area between the powdery raw materials and hence an impurity phase which cannot lead to synthesis of a preferred phosphor may remain in a large amount. On the other hand, when the bulk density is too large, the resulting phosphor may become a hard sintered one, which not only requires a long-term pulverization step after baking but also tends to lower luminance of the phosphor. Therefore, the bulk density is preferably from 0.15 g/cm$^3$ to 0.8 g/cm$^3$.

When the baking temperature of the raw mixed powder is too low, the solid phase reaction is difficult to proceed and the aimed phosphor cannot be synthesized. On the other hand, when it is too high, not only unproductive baking energy is consumed but also evaporation of nitrogen from the starting material and the produced substance increases and hence there is a tendency that the aimed phosphor cannot be produced unless the pressure of nitrogen which constitutes part of atmosphere gas is increased to a very high pressure. Therefore, the baking temperature is preferably from 1300° C. to 1700° C. The baking atmosphere of the raw mixed powder is in principle an inert atmosphere or a reductive atmosphere but the use of an atmosphere containing a minute amount of oxygen wherein the oxygen concentration is in the range of 0.1 to 10 ppm is preferred since it becomes possible to synthesize a phosphor at a relatively low temperature.

Moreover, the pressure of atmosphere gas at baking is usually 20 atm (2 MPa) or lower. A high-temperature baking equipment comprising a strong heat-resistant vessel is required for a pressure exceeding 20 atm and hence the cost necessary for baking becomes high, so that the pressure of the atmosphere gas is preferably 10 atm (1 MPa) or lower. In order to prevent contamination of oxygen in the air, the pressure is preferably slight higher than 1 atm (0.1 MPa). In the case that air-tightness of the baking furnace is wrong, when the pressure is 1 atm (0.1 MPa) or lower, a lot of oxygen contaminates the atmosphere gas and hence it is difficult to obtain a phosphor having excellent characteristics.

Furthermore, the holding time at the maximum temperature at baking is usually from 1 minute to 100 hours. When the holding time is too short, the solid phase reaction between raw mixed powders does not sufficiently proceed and an aimed phosphor cannot be obtained. When the holding time is too long, not only unproductive baking energy is consumed but also nitrogen is eliminated from the surface of the phosphor and the fluorescence characteristics deteriorate. For the same reasons, the holding time is preferably from 10 minutes to 24 hours.

As explained in the above, the CaAlSiN$_3$ family crystal phase phosphor of the invention exhibits a higher luminance than that of conventional sialon phosphors and, since decrease in luminance of the phosphor is small when it is exposed to an excitation source, it is a phosphor suitable for VFD, FED, PDP, CRT, white LED, and the like.

The lighting equipment of the invention is constituted by the use of at least a light-emitting source and the phosphor of the invention. As the lighting equipment, there may be mentioned an LED lighting equipment, a fluorescent lamp, and the like. The LED lighting equipment can be produced by known methods as described in JP-A-5-152609, JP-A-7-99345, Japanese Patent No. 2927279, and so forth with the phosphor of the invention. In this case, the light-emitting source is desirably one emitting a light having a wavelength of 330 to 500 nm, and particularly preferred is an ultraviolet (or violet) LED light-emitting element of 330 to 420 nm or a blue LED light-emitting element of 420 to 500 nm.

As these light-emitting elements, there exist an element comprising a nitride semiconductor such as GaN or InGaN and the like and, by adjusting the composition, it may be employed as a light-emitting source which emits a light having a predetermined wavelength.

In the lighting equipment, in addition to the method of using the phosphor of the invention solely, by the combined use thereof with a phosphor having other emission characteristics, a lighting equipment emitting a desired color can be constituted. As one example, there is a combination of an ultraviolet LED light-emitting element of 330 to 420 nm with a blue phosphor excited at the wavelength and having an emission peak at a wavelength of 420 nm to 500 nm, a green phosphor excited at the wavelength of 330 to 420 nm and having an emission peak at a wavelength of 500 nm to 570 nm, and the phosphor of the invention. There may be mentioned BaMgAl$_{10}$O$_{17}$:Eu as the blue phosphor and BaMgAl$_{10}$O$_{17}$:Eu,Mn as the green phosphor. In this constitution, when the phosphors are irradiated with an ultraviolet ray emitted by the LED, red, green, and blue lights are emitted and a white lighting equipment is formed by mixing the lights.

As an alternative method, there is a combination of a blue LED light-emitting element of 420 to 500 nm with a yellow phosphor excited at the wavelength and having an emission peak at a wavelength of 550 nm to 600 nm and the phosphor of the invention. As such a yellow phosphor, there may be mentioned (Y, Gd)$_2$ (Al, Ga)$_5$O$_{12}$: Ce described in Japanese Patent No. 2927279 and α-sialon:Eu described in JP-A-2002-363554. Of these, a Ca-α-sialon in which Eu is dissolved is preferred owing to high emission luminance. In this constitution, when the phosphors are irradiated with a blue light emitted by the LED, two lights having red and yellow colors are emitted and the lights are mixed with the blue light of LED itself to form a lighting equipment exhibiting a white color or a reddish lamp color.

As another method, there is a combination of a blue LED light-emitting element of 420 to 500 nm with a green phosphor excited at the wavelength and having an emission peak at a wavelength of 500 nm to 570 nm and the phosphor of the invention. As such a green phosphor, there may be mentioned Y$_2$Al$_5$O$_{12}$:Ce. In this constitution, when the phosphors are irradiated with a blue light emitted by the LED, two lights having red and green colors are emitted and the lights are mixed with the blue light of LED itself to form a white lighting equipment.

The image display unit of the invention is constituted by at least an excitation source and the phosphor of the invention and includes a vacuum fluorescent display (VFD), a field emission display (FED), a plasma display panel (PDP), a cathode ray tube (CRT), and the like. The phosphor of the invention is confirmed to emit a light by excitation with a vacuum ultraviolet ray of 100 to 190 nm, an ultraviolet ray of 190 to 380 nm, an electron beam, or the like. Thus, by the combination of any of these excitation sources and the phosphor of the invention, the image display unit as above can be constituted.

Since the specific inorganic compound of the invention has a red object color, it can be used as a red pigment or a red fluorescent pigment. When the inorganic compound of the invention is irradiated with illumination of sunlight, fluorescent lamp, or the like, a red object color is observed and the compound is suitable as an inorganic pigment owing to good coloring and no deterioration over a long period of time. Therefore, there is an advantage that the coloring does not decrease over a long period of time when it is used in coatings, inks, colors, glazes, colorants added to plastic products or the like. The nitride of the invention absorbs ultraviolet rays and hence is suitable as an ultraviolet absorbent. Therefore, when the nitride is used as a coating or applied on the surface of plastic products or kneaded into the products, the effect of shielding ultraviolet rays is high and thus the effect of protecting the products from ultraviolet degradation is high.

EXAMPLES

The following will describe the invention further in detail with reference to the following Examples but they are disclosed only for the purpose of easy understanding of the invention and the invention is not limited to these Examples.

Example 1

As raw powders were used a silicon nitride powder having an average particle size of 0.5 μm, an oxygen content of 0.93% by weight, and an α-type content of 92%, an aluminum nitride powder having a specific surface area of 3.3 m²/g and an oxygen content of 0.79%, a calcium nitride powder, and europium nitride synthesized by nitriding metal europium in ammonia.

In order to obtain a compound represented by the composition formula: $Eu_{0.008}Ca_{0.992}AlSiN_3$ (Table 1 shows parameters for designed composition, Table 2 shows designed composition (% by weight), and Table 3 shows a mixing composition of a raw powder), the silicon nitride powder, the aluminum nitride powder, the calcium nitride powder, and the europium nitride powder were weighed so as to be 33.8578% by weight, 29.6814% by weight, 35.4993% by weight, and 0.96147% by weight, respectively, followed by 30 minutes of mixing by means of an agate mortar and pestle. Thereafter, the resulting mixture was allowed to fall freely into a crucible made of boron nitride through a sieve of 500 μm to fill the crucible with the powder. The volume-filling rate of the powder was about 25%. In this connection, respective steps of weighing, mixing, and molding of the powders were all conducted in a globe box capable of maintaining a nitrogen atmosphere having a moisture content of 1 ppm or less and an oxygen content of 1 ppm or less.

The mixed powder was placed in a crucible made of boron nitride and set in a graphite resistive heating-type electric furnace. The baking operations were conducted as follows: the baking atmosphere was first vacuumed by a diffusion pump, heated from room temperature to 800° C. at a rate of 500° C. per hour, and pressurized to 1 MPa by introducing nitrogen having a purity of 99.999% by volume at 800° C., and the temperature was elevated to 1800° C. at a rate of 500° C. per hour and held at 1800° C. for 2 hours.

After baking, the resulting baked product was roughly pulverized and then was pulverized by hand using a crucible and mortar made of silicon nitride sintered compact, followed by filtering through a sieve having a mesh of 30 μm. When the particle distribution was measured, the average particle size was found to be 15 μm.

The constitutive crystal phase of the resulting synthetic powder was identified according to the following procedure. First, in order to obtain pure $CaAlSiN_3$ containing no M Element as a standard substance, the silicon nitride powder, the aluminum nitride powder, and the calcium nitride powder were weighed so as to be 34.088% by weight, 29.883% by weight, and 36.029% by weight, respectively, followed by 30 minutes of mixing by means of an agate mortar and pestle in a globe box. Then, the mixture was placed in a crucible made of boron nitride and set in a graphite resistive heating-type electric furnace. The baking operations were conducted as follows: the baking atmosphere was first vacuumed by a diffusion pump, heated from warm room to 800° C. at a rate of 500° C. per hour, and pressurized to 1 MPa by introducing nitrogen having a purity of 99.999% by volume at 800° C., and the temperature was elevated to 1800° C. at a rate of 500° C. per hour and held at 1800° C. for 2 hours. The synthesized sample was pulverized by means of an agate mortar and then measurement of powder X-ray diffraction was conducted using Kα line of Cu. As a result, the resulting chart shows a pattern illustrated in FIGS. 1-1 and the compound was judged to be a $CaAlSiN_3$ crystal phase based on indexing shown in Table 4. The crystal phase is an orthorhombic system, which has lattice constants of a=9.8007(4) Å, b=5.6497(2) Å, and c=5.0627 (2) Å. A space group determined by convergent beam electron diffraction using TEM is $Cmc2_1$ (36th space group of International Tables for Crystallography). Furthermore, the atomic coordinate position of each element determined by the Rietveld analysis using the space group is as shown in Table 5. The measured intensity of X-ray diffraction and the calculated intensity computed by the Rietveld method from the atomic coordinates show a good coincidence as shown in Table 4.

Next, the synthesized compound represented by the composition formula: $Eu_{0.008}Ca_{0.992}AlSiN_3$ was pulverized by means of an agate mortar and then measurement of powder X-ray diffraction was conducted using Kα line of Cu. As a result, the resulting chart is shown in FIGS. 1-2 and the compound was judged to be a $CaAlSiN_3$ family crystal phase based on indexing shown in Table 4.

The composition analysis of the powder was conducted by the following method. First, 50 mg of the sample was placed in a platinum crucible and 0.5 g of sodium carbonate and 0.2 g of boric acid were added thereto, followed by heating and melting the whole. Thereafter, the melt was dissolved in 2 ml of hydrochloric acid to be a constant volume of 100 ml, whereby a solution for measurement: was prepared. By subjecting the liquid sample to ICP emission spectrometry, the amounts of Si, Al, Eu, and Ca in the powder sample were quantitatively determined. Moreover, 20 mg of the sample was charged into a Tin capsule, which was then placed in a nickel basket. Then, using TC-436 Model oxygen and nitrogen analyzer manufactured by LECO, oxygen and nitrogen in the powder sample were quantitatively determined. The results of the measurement were as follows: Eu: 0.86±0.01% by weight, Ca: 28.9±0.1% by weight, Si: 20.4±0.1% by weight, Al: 19.6±0.1% by weight, N, 28.3±0.2% by weight, O: 2.0±0.1% by weight. In comparison with the indicated % by weight in the designed composition shown in Table 2, an oxygen content is especially high. The reason therefor is attributed to impurity oxygen contained in silicon nitride, aluminum nitride, and calcium nitride, which were employed as raw materials. In this composition, the ratio of number of atoms of N and O, N/(0+N) corresponds to 0.942. The composition of the synthesized inorganic compound calculated from the analytical results of all the elements is $EU_{0.0078}Ca_{0.9922}Si_{0.9997}Al_{0.9996}N_{2.782}O_{0.172}$. In the invention, one wherein part of N is replaced with 0 is also included in the scope of the invention and, even in that case, a high-luminance red phosphor is obtained.

As a result of irradiation of the powder with a lamp emitting a light having a wavelength of 365 nm, emission of a red light was confirmed. As a result of measurement of emission spectrum (FIG. 4) and excitation spectrum (FIG. 5) of the powder using a fluorescence spectrophotometer, with regard to the peak wavelengths of the excitation and emission spectra (Table 6), it was found that the peak of the excitation spectrum was present at 449 nm and it was a phosphor having a peak at a red light of 653 nm in the emission spectrum with excitation at 449 nm. The emission intensity of the peak was 10655 counts. In this connection, since the count value varies depending on the measuring apparatus and conditions, the unit is an arbitrary unit. Moreover, the CIE chromaticity determined from the emission spectrum with excitation at 449 nm was red color of x=0.6699 and y=0.3263.

TABLE 1

Parameters for designed composition

| Example | M Element Eu a Value | A Element Mg | A Element Ca b Value | A Element Sr | A Element Ba | D Element Si c Value | E Element Al d Value | X Element N e Value |
|---|---|---|---|---|---|---|---|---|
| 1 | 0.008 | 0 | 0.992 | 0 | 0 | 1 | 1 | 3 |
| 2 | 0.008 | 0 | 0 | 0 | 0.992 | 1 | 1 | 3 |
| 3 | 0.008 | 0 | 0.1984 | 0 | 0.7936 | 1 | 1 | 3 |
| 4 | 0.008 | 0 | 0.3968 | 0 | 0.5952 | 1 | 1 | 3 |
| 5 | 0.008 | 0 | 0.5952 | 0 | 0.3968 | 1 | 1 | 3 |
| 6 | 0.008 | 0 | 0.7936 | 0 | 0.1984 | 1 | 1 | 3 |
| 7 | 0.008 | 0 | 0.8928 | 0 | 0.0992 | 1 | 1 | 3 |
| 8 | 0.008 | 0 | 0.8928 | 0.0992 | 0 | 1 | 1 | 3 |
| 9 | 0.008 | 0 | 0.7936 | 0.1984 | 0 | 1 | 1 | 3 |
| 10 | 0.008 | 0 | 0.6944 | 0.2976 | 0 | 1 | 1 | 3 |
| 11 | 0.008 | 0 | 0.5952 | 0.3968 | 0 | 1 | 1 | 3 |
| 12 | 0.008 | 0 | 0.496 | 0.496 | 0 | 1 | 1 | 3 |
| 13 | 0.008 | 0 | 0.3968 | 0.5952 | 0 | 1 | 1 | 3 |
| 14 | 0.008 | 0 | 0.1984 | 0.7936 | 0 | 1 | 1 | 3 |
| 15 | 0.008 | 0 | 0 | 0.992 | 0 | 1 | 1 | 3 |
| 16 | 0.008 | 0.0992 | 0.8928 | 0 | 0 | 1 | 1 | 3 |
| 17 | 0.008 | 0.1984 | 0.7936 | 0 | 0 | 1 | 1 | 3 |
| 18 | 0.008 | 0.2976 | 0.6944 | 0 | 0 | 1 | 1 | 3 |
| 19 | 0.008 | 0.3968 | 0.5952 | 0 | 0 | 1 | 1 | 3 |
| 20 | 0.008 | 0.496 | 0.496 | 0 | 0 | 1 | 1 | 3 |
| 21 | 0.008 | 0.5952 | 0.3968 | 0 | 0 | 1 | 1 | 3 |
| 22 | 0.008 | 0.6944 | 0.2976 | 0 | 0 | 1 | 1 | 3 |
| 23 | 0.008 | 0.7936 | 0.1984 | 0 | 0 | 1 | 1 | 3 |
| 24 | 0.008 | 0.8928 | 0.0992 | 0 | 0 | 1 | 1 | 3 |
| 25 | 0.008 | 0.992 | 0 | 0 | 0 | 1 | 1 | 3 |

TABLE 2

Designed composition (% by weight)

| Example | Eu | Mg | Ca | Sr | Ba | Si | Al | N |
|---|---|---|---|---|---|---|---|---|
| 1 | 0.88056 | 0 | 28.799 | 0 | 0 | 20.3393 | 19.544 | 30.4372 |
| 2 | 0.51833 | 0 | 0 | 0 | 58.0887 | 11.9724 | 11.5042 | 17.9163 |
| 3 | 0.56479 | 0 | 3.69436 | 0 | 50.6371 | 13.0457 | 12.5356 | 19.5225 |
| 4 | 0.62041 | 0 | 8.11634 | 0 | 41.7178 | 14.3304 | 13.77 | 21.4451 |
| 5 | 0.68818 | 0 | 13.5044 | 0 | 30.8499 | 15.8958 | 15.2742 | 23.7876 |
| 6 | 0.77257 | 0 | 20.2139 | 0 | 17.3165 | 17.8451 | 17.1473 | 26.7047 |
| 7 | 0.82304 | 0 | 24.2261 | 0 | 9.2238 | 19.0107 | 18.2673 | 28.449 |
| 8 | 0.85147 | 0 | 25.063 | 6.08788 | 0 | 19.6674 | 18.8984 | 29.4318 |
| 9 | 0.82425 | 0 | 21.5659 | 11.7864 | 0 | 19.0386 | 18.2941 | 28.4907 |
| 10 | 0.79871 | 0 | 18.2855 | 17.1319 | 0 | 18.4487 | 17.7273 | 27.608 |
| 11 | 0.7747 | 0 | 15.2022 | 22.156 | 0 | 17.8943 | 17.1945 | 26.7783 |
| 12 | 0.7521 | 0 | 12.2989 | 26.887 | 0 | 17.3722 | 16.6929 | 25.997 |
| 13 | 0.73078 | 0 | 9.56019 | 31.3497 | 0 | 16.8797 | 16.2196 | 25.26 |
| 14 | 0.69157 | 0 | 4.52361 | 39.5568 | 0 | 15.974 | 15.3494 | 23.9047 |
| 15 | 0.65635 | 0 | 0 | 46.928 | 0 | 15.1605 | 14.5677 | 22.6874 |
| 16 | 0.89065 | 1.76643 | 26.2163 | 0 | 0 | 20.5725 | 19.768 | 30.7862 |
| 17 | 0.90098 | 3.57383 | 23.5736 | 0 | 0 | 20.8111 | 19.9973 | 31.1432 |
| 18 | 0.91155 | 5.42365 | 20.869 | 0 | 0 | 21.0553 | 20.2319 | 31.5086 |
| 19 | 0.92238 | 7.3174 | 18.1001 | 0 | 0 | 21.3052 | 20.4722 | 31.8828 |
| 20 | 0.93346 | 9.25666 | 15.2646 | 0 | 0 | 21.5612 | 20.7181 | 32.2659 |
| 21 | 0.94481 | 11.2431 | 12.3602 | 0 | 0 | 21.8235 | 20.9701 | 32.6583 |
| 22 | 0.95645 | 13.2784 | 9.3843 | 0 | 0 | 22.0922 | 21.2283 | 33.0604 |

TABLE 2-continued

| | Designed composition (% by weight) | | | | | | | |
|---|---|---|---|---|---|---|---|---|
| Example | Eu | Mg | Ca | Sr | Ba | Si | Al | N |
| 23 | 0.96837 | 15.3645 | 6.33418 | 0 | 0 | 22.3676 | 21.4929 | 33.4725 |
| 24 | 0.98059 | 17.5033 | 3.20707 | 0 | 0 | 22.6499 | 21.7642 | 33.895 |
| 25 | 0.99313 | 19.6967 | 0 | 0 | 0 | 22.9394 | 22.0425 | 34.3283 |

TABLE 3

| | Mixing composition (% by weight) | | | | | | |
|---|---|---|---|---|---|---|---|
| Example | EuN | Mg3N2 | Ca3N2 | Sr3N2 | Ba3N2 | Si3N4 | AlN |
| 1 | 0.96147 | 0 | 35.4993 | 0 | 0 | 33.8578 | 29.6814 |
| 2 | 0.56601 | 0 | 0 | 0 | 62.0287 | 19.932 | 17.4733 |
| 3 | 0.61675 | 0 | 4.55431 | 0 | 54.0709 | 21.7185 | 19.0395 |
| 4 | 0.67747 | 0 | 10.0054 | 0 | 44.546 | 23.8569 | 20.9142 |
| 5 | 0.75146 | 0 | 16.6472 | 0 | 32.9406 | 26.4624 | 23.1982 |
| 6 | 0.84359 | 0 | 24.9176 | 0 | 18.4896 | 29.7068 | 26.0424 |
| 7 | 0.89868 | 0 | 29.863 | 0 | 9.84853 | 31.6467 | 27.7431 |
| 8 | 0.92972 | 0 | 30.8943 | 6.73497 | 0 | 32.7397 | 28.7012 |
| 9 | 0.9 | 0 | 26.5838 | 13.0394 | 0 | 31.6931 | 27.7837 |
| 10 | 0.87212 | 0 | 22.5403 | 18.9531 | 0 | 30.7114 | 26.9231 |
| 11 | 0.84592 | 0 | 18.7397 | 24.5116 | 0 | 29.7886 | 26.1142 |
| 12 | 0.82124 | 0 | 15.1609 | 29.7457 | 0 | 28.9197 | 25.3524 |
| 13 | 0.79797 | 0 | 11.785 | 34.6832 | 0 | 28.1 | 24.6339 |
| 14 | 0.75516 | 0 | 5.57638 | 43.7635 | 0 | 26.5926 | 23.3124 |
| 15 | 0.71671 | 0 | 0 | 51.9191 | 0 | 25.2387 | 22.1255 |
| 16 | 0.97249 | 2.44443 | 32.3156 | 0 | 0 | 34.2459 | 30.0216 |
| 17 | 0.98377 | 4.94555 | 29.058 | 0 | 0 | 34.6429 | 30.3697 |
| 18 | 0.99531 | 7.50535 | 25.724 | 0 | 0 | 35.0493 | 30.726 |
| 19 | 1.00712 | 10.1259 | 22.3109 | 0 | 0 | 35.4654 | 31.0907 |
| 20 | 1.01922 | 12.8095 | 18.8158 | 0 | 0 | 35.8914 | 31.4642 |
| 21 | 1.03161 | 15.5582 | 15.2356 | 0 | 0 | 36.3278 | 31.8467 |
| 22 | 1.04431 | 18.3747 | 11.5674 | 0 | 0 | 36.7749 | 32.2387 |
| 23 | 1.05732 | 21.2613 | 7.80768 | 0 | 0 | 37.2332 | 32.6404 |
| 24 | 1.07067 | 24.2208 | 3.9531 | 0 | 0 | 37.7031 | 33.0523 |
| 25 | 1.08435 | 27.256 | 0 | 0 | 0 | 38.1849 | 33.4748 |

TABLE 4

| Peak No. | Indices | | | 2θ degree | Spacing Å | Observed intensity arbitrary unit | Calculated intensity arbitrary unit |
|---|---|---|---|---|---|---|---|
| | h | k | l | | | | |
| Results of X-ray diffraction (No. 1) | | | | | | | |
| 1 | 2 | 0 | 0 | 18.088 | 4.90033 | 1129 | 360 |
| 2 | 1 | 1 | 0 | 18.109 | 4.89464 | 3960 | 1242 |
| 3 | 2 | 0 | 0 | 18.133 | 4.90033 | 569 | 178 |
| 4 | 1 | 1 | 0 | 18.154 | 4.89464 | 1993 | 614 |
| 5 | 1 | 1 | 1 | 25.288 | 3.51896 | 3917 | 5137 |
| 6 | 1 | 1 | 1 | 25.352 | 3.51896 | 1962 | 2539 |
| 7 | 3 | 1 | 0 | 31.61 | 2.82811 | 72213 | 68028 |
| 8 | 0 | 2 | 0 | 31.648 | 2.82483 | 38700 | 36445 |
| 9 | 3 | 1 | 0 | 31.691 | 2.82811 | 35723 | 33624 |
| 10 | 0 | 2 | 0 | 31.729 | 2.82483 | 19158 | 18014 |
| 11 | 0 | 0 | 2 | 35.431 | 2.53137 | 75596 | 78817 |
| 12 | 0 | 0 | 2 | 35.522 | 2.53137 | 37579 | 39097 |
| 13 | 3 | 1 | 1 | 36.357 | 2.469 | 100000 | 101156 |
| 14 | 0 | 2 | 1 | 36.391 | 2.4668 | 56283 | 56923 |
| 15 | 3 | 1 | 1 | 36.451 | 2.469 | 49334 | 49816 |
| 16 | 0 | 2 | 1 | 36.484 | 2.4668 | 27873 | 28187 |
| 17 | 4 | 0 | 0 | 36.647 | 2.45017 | 15089 | 15187 |
| 18 | 2 | 2 | 0 | 36.691 | 2.44732 | 11430 | 11483 |
| 19 | 4 | 0 | 0 | 36.741 | 2.45017 | 7481 | 7507 |
| 20 | 2 | 2 | 0 | 36.785 | 2.44732 | 5661 | 5676 |
| 21 | 2 | 0 | 2 | 40.058 | 2.24902 | 5403 | 5599 |
| 22 | 1 | 1 | 2 | 40.068 | 2.24847 | 76 | 79 |
| 23 | 2 | 0 | 2 | 40.162 | 2.24902 | 2678 | 2767 |
| 24 | 1 | 1 | 2 | 40.172 | 2.24847 | 38 | 39 |
| 25 | 2 | 2 | 1 | 40.924 | 2.20339 | 14316 | 13616 |
| 26 | 2 | 2 | 1 | 41.031 | 2.20339 | 7123 | 6730 |
| 27 | 3 | 1 | 2 | 48.207 | 1.88616 | 21363 | 21434 |
| 28 | 0 | 2 | 2 | 48.233 | 1.88519 | 19002 | 19072 |
| 29 | 3 | 1 | 2 | 48.334 | 1.88616 | 10584 | 10591 |
| 30 | 0 | 2 | 2 | 48.361 | 1.88519 | 9407 | 9424 |
| 31 | 5 | 1 | 0 | 49.159 | 1.85184 | 2572 | 2513 |
| 32 | 4 | 2 | 0 | 49.185 | 1.85092 | 4906 | 4795 |
| 33 | 1 | 3 | 0 | 49.228 | 1.84939 | 253 | 239 |
| 34 | 5 | 1 | 0 | 49.289 | 1.85184 | 1346 | 1242 |
| 35 | 4 | 2 | 0 | 49.315 | 1.85092 | 2565 | 2369 |
| 36 | 1 | 3 | 0 | 49.359 | 1.84939 | 130 | 118 |
| 37 | 4 | 0 | 2 | 51.892 | 1.76054 | 6201 | 6580 |
| 38 | 2 | 2 | 2 | 51.926 | 1.75948 | 6187 | 6564 |
| 39 | 4 | 0 | 2 | 51.031 | 1.76054 | 3075 | 3251 |
| 40 | 2 | 2 | 2 | 52.064 | 1.75948 | 3078 | 3243 |
| 41 | 5 | 1 | 1 | 52.579 | 1.73915 | 2042 | 2153 |
| 42 | 4 | 2 | 1 | 52.604 | 1.73839 | 188 | 199 |
| 43 | 1 | 3 | 1 | 52.645 | 1.73712 | 282 | 298 |
| 44 | 5 | 1 | 1 | 52.72 | 1.73915 | 1002 | 1064 |
| 45 | 4 | 2 | 1 | 52.745 | 1.73839 | 92 | 98 |
| 46 | 1 | 3 | 1 | 52.786 | 1.73712 | 139 | 147 |
| 47 | 6 | 0 | 0 | 56.272 | 1.63344 | 17721 | 17283 |
| 48 | 3 | 3 | 0 | 56.344 | 1.63155 | 33576 | 32772 |

TABLE 4-continued

| Peak No. | Indices h | k | l | 2θ degree | Spacing Å | Observed intensity arbitrary unit | Calculated intensity arbitrary unit |
|---|---|---|---|---|---|---|---|
| 49 | 6 | 0 | 0 | 56.425 | 1.63344 | 8757 | 8541 |
| 50 | 3 | 3 | 0 | 56.496 | 1.63155 | 16569 | 16195 |
| Results of X-ray diffraction (No. 2) | | | | | | | |
| 51 | 1 | 1 | 3 | 57.738 | 1.59541 | 771 | 461 |
| 52 | 1 | 1 | 3 | 57.895 | 1.59541 | 447 | 228 |
| 53 | 3 | 3 | 1 | 59.475 | 1.5529 | 987 | 445 |
| 54 | 3 | 3 | 1 | 59.638 | 1.5529 | 504 | 220 |
| 55 | 5 | 1 | 2 | 62.045 | 1.4946 | 421 | 460 |
| 56 | 4 | 2 | 2 | 62.068 | 1.49412 | 3824 | 4174 |
| 57 | 1 | 3 | 2 | 62.105 | 1.49331 | 518 | 571 |
| 58 | 5 | 1 | 2 | 62.217 | 1.4946 | 209 | 227 |
| 59 | 4 | 2 | 2 | 62.239 | 1.49412 | 1886 | 2063 |
| 60 | 1 | 3 | 2 | 62.276 | 1.49331 | 257 | 282 |
| 61 | 3 | 1 | 3 | 64.218 | 1.44918 | 25890 | 27958 |
| 62 | 0 | 2 | 3 | 64.239 | 1.44874 | 19133 | 20597 |
| 63 | 3 | 1 | 3 | 64.396 | 1.44918 | 12851 | 13816 |
| 64 | 0 | 2 | 3 | 64.418 | 1.44874 | 9441 | 10178 |
| 65 | 6 | 2 | 0 | 66.013 | 1.41406 | 6643 | 6534 |
| 66 | 0 | 4 | 0 | 66.099 | 1.41242 | 2793 | 2737 |
| 67 | 6 | 2 | 0 | 66.198 | 1.41406 | 3327 | 3229 |
| 68 | 0 | 4 | 0 | 66.284 | 1.41242 | 1385 | 1315 |
| 69 | 2 | 2 | 3 | 67.344 | 1.3893 | 3814 | 3509 |
| 70 | 2 | 2 | 3 | 67.534 | 1.3893 | 1869 | 1735 |
| 71 | 6 | 0 | 2 | 68.281 | 1.3725 | 18466 | 17968 |
| 72 | 3 | 3 | 2 | 68.345 | 1.37138 | 27397 | 26670 |
| 73 | 6 | 0 | 2 | 68.474 | 1.3725 | 9086 | 8881 |
| 74 | 3 | 3 | 2 | 68.538 | 1.37138 | 13419 | 13182 |
| 75 | 6 | 2 | 1 | 68.885 | 1.36193 | 22014 | 21698 |
| 76 | 0 | 4 | 1 | 68.97 | 1.36046 | 11088 | 10930 |
| 77 | 7 | 1 | 0 | 69.056 | 1.35899 | 827 | 815 |
| 78 | 6 | 2 | 1 | 69.081 | 1.36193 | 10883 | 10725 |
| 79 | 5 | 3 | 0 | 69.112 | 1.35802 | 573 | 564 |
| 80 | 2 | 4 | 0 | 69.161 | 1.35717 | 4360 | 4307 |
| 81 | 0 | 4 | 1 | 69.166 | 1.36046 | 5470 | 5403 |
| 82 | 7 | 1 | 0 | 69.252 | 1.35899 | 409 | 403 |
| 83 | 5 | 3 | 0 | 69.308 | 1.35802 | 283 | 279 |
| 84 | 2 | 4 | 0 | 69.358 | 1.35717 | 2165 | 2129 |
| 85 | 7 | 1 | 1 | 71.871 | 1.31252 | 263 | 170 |
| 86 | 5 | 3 | 1 | 71.926 | 1.31165 | 684 | 445 |
| 87 | 2 | 4 | 1 | 71.974 | 1.31088 | 810 | 520 |
| 88 | 7 | 1 | 1 | 72.077 | 1.31252 | 132 | 84 |
| 89 | 5 | 3 | 1 | 72.133 | 1.31165 | 345 | 220 |
| 90 | 2 | 4 | 1 | 72.181 | 1.31088 | 399 | 257 |
| 91 | 0 | 0 | 4 | 74.975 | 1.26568 | 3881 | 3841 |
| 92 | 0 | 0 | 4 | 75.194 | 1.26568 | 1960 | 1899 |
| 93 | 5 | 1 | 3 | 76.274 | 1.24734 | 1812 | 1659 |
| 94 | 4 | 2 | 3 | 76.294 | 1.23707 | 865 | 798 |
| 95 | 1 | 3 | 3 | 76.328 | 1.24659 | 516 | 478 |
| 96 | 5 | 1 | 3 | 76.497 | 1.24734 | 826 | 820 |
| 97 | 4 | 2 | 3 | 76.518 | 1.24705 | 403 | 395 |
| 98 | 1 | 3 | 3 | 76.552 | 1.24659 | 241 | 237 |
| 99 | 6 | 2 | 2 | 77.212 | 1.2345 | 6989 | 7316 |
| 100 | 0 | 4 | 2 | 77.293 | 1.23341 | 1114 | 1179 |
| Results of X-ray diffraction (No. 3) | | | | | | | |
| 101 | 6 | 2 | 2 | 77.439 | 1.2345 | 3384 | 3619 |
| 102 | 0 | 4 | 2 | 77.521 | 1.23341 | 542 | 583 |
| 103 | 2 | 0 | 4 | 77.888 | 1.22547 | 2080 | 2260 |
| 104 | 1 | 1 | 4 | 77.895 | 1.22538 | 237 | 253 |
| 105 | 8 | 0 | 0 | 77.917 | 1.22508 | 32 | 35 |
| 106 | 4 | 4 | 0 | 78.025 | 1.22366 | 144 | 155 |
| 107 | 2 | 0 | 4 | 78.118 | 1.22547 | 1016 | 1118 |
| 108 | 1 | 1 | 4 | 78.125 | 1.22538 | 113 | 125 |
| 109 | 8 | 0 | 0 | 78.148 | 1.22508 | 16 | 17 |
| 110 | 4 | 4 | 0 | 78.256 | 1.22366 | 69 | 77 |
| 111 | 7 | 1 | 2 | 80.08 | 1.19735 | 671 | 762 |
| 112 | 5 | 3 | 2 | 80.134 | 1.19668 | 45 | 51 |
| 113 | 2 | 4 | 2 | 80.18 | 1.1961 | 2092 | 2383 |
| 114 | 7 | 1 | 2 | 80.32 | 1.19735 | 332 | 377 |
| 115 | 5 | 3 | 2 | 80.373 | 1.19668 | 22 | 25 |
| 116 | 2 | 4 | 2 | 80.42 | 1.1961 | 1032 | 1179 |
| 117 | 4 | 4 | 1 | 80.724 | 1.18941 | 1023 | 1169 |
| 118 | 4 | 4 | 1 | 80.966 | 1.18941 | 504 | 579 |
| 119 | 3 | 3 | 3 | 82.095 | 1.17299 | 566 | 560 |
| 120 | 3 | 3 | 3 | 82.343 | 1.17299 | 249 | 277 |
| 121 | 3 | 1 | 4 | 83.634 | 1.15527 | 2395 | 2418 |
| 122 | 0 | 2 | 4 | 83.654 | 1.15504 | 2611 | 2637 |
| 123 | 3 | 1 | 4 | 83.889 | 1.15527 | 1191 | 1197 |
| 124 | 0 | 2 | 4 | 83.909 | 1.15504 | 1309 | 1306 |
| 125 | 4 | 0 | 4 | 86.47 | 1.12451 | 531 | 492 |
| 126 | 2 | 2 | 4 | 86.496 | 1.12423 | 1172 | 1090 |
| 127 | 8 | 2 | 0 | 86.525 | 1.12394 | 278 | 258 |
| 128 | 7 | 3 | 0 | 86.558 | 1.12359 | 934 | 864 |
| 129 | 1 | 5 | 0 | 86.663 | 1.1225 | 737 | 688 |
| 130 | 4 | 0 | 4 | 86.738 | 1.12451 | 262 | 244 |
| 131 | 2 | 2 | 4 | 86.765 | 1.12423 | 585 | 540 |
| 132 | 8 | 2 | 0 | 86.793 | 1.12394 | 139 | 128 |
| 133 | 7 | 3 | 0 | 86.826 | 1.12359 | 467 | 428 |
| 134 | 1 | 5 | 0 | 86.932 | 1.1225 | 367 | 341 |
| 135 | 8 | 0 | 2 | 88.617 | 1.10273 | 102 | 99 |
| 136 | 4 | 4 | 2 | 88.722 | 1.10169 | 1094 | 1054 |
| 137 | 8 | 0 | 2 | 88.895 | 1.10273 | 50 | 49 |
| 138 | 4 | 4 | 2 | 89.001 | 1.10169 | 525 | 523 |
| 139 | 8 | 2 | 1 | 89.18 | 1.09723 | 495 | 480 |
| 140 | 7 | 3 | 1 | 89.213 | 1.09691 | 551 | 552 |
| 141 | 1 | 5 | 1 | 89.318 | 1.09588 | 123 | 123 |
| 142 | 8 | 2 | 1 | 89.461 | 1.09723 | 239 | 238 |
| 143 | 7 | 3 | 1 | 89.494 | 1.09691 | 271 | 274 |
| 144 | 1 | 5 | 1 | 89.6 | 1.09588 | 60 | 61 |
| 145 | 6 | 2 | 3 | 90.581 | 1.08386 | 8698 | 8736 |
| 146 | 0 | 4 | 3 | 90.66 | 1.08312 | 4187 | 4201 |
| 147 | 6 | 2 | 3 | 90.869 | 1.08386 | 4305 | 4332 |
| 148 | 0 | 4 | 3 | 90.949 | 1.08312 | 2067 | 2083 |
| 149 | 9 | 1 | 0 | 92.171 | 1.06928 | 921 | 787 |
| 150 | 6 | 4 | 0 | 92.269 | 1.06839 | 820 | 696 |
| Results of X-ray diffraction (No. 4) | | | | | | | |
| 151 | 3 | 5 | 0 | 92.329 | 1.06786 | 846 | 709 |
| 152 | 9 | 1 | 0 | 92.467 | 1.06928 | 466 | 390 |
| 153 | 6 | 4 | 0 | 92.566 | 1.06839 | 403 | 346 |
| 154 | 3 | 5 | 0 | 92.626 | 1.06786 | 407 | 352 |
| 155 | 7 | 1 | 3 | 93.395 | 1.05845 | 882 | 812 |
| 156 | 5 | 3 | 3 | 93.448 | 1.058 | 1111 | 1042 |
| 157 | 2 | 4 | 3 | 93.494 | 1.05759 | 575 | 533 |
| 158 | 7 | 1 | 3 | 93.697 | 1.05845 | 439 | 403 |
| 159 | 5 | 3 | 3 | 93.75 | 1.058 | 557 | 517 |
| 160 | 2 | 4 | 3 | 93.797 | 1.05759 | 286 | 264 |
| 161 | 9 | 1 | 1 | 94.828 | 1.0462 | 8091 | 7983 |
| 162 | 6 | 4 | 1 | 94.928 | 1.04537 | 8273 | 8175 |
| 163 | 5 | 1 | 4 | 94.979 | 1.04494 | 392 | 387 |
| 164 | 3 | 5 | 1 | 94.987 | 1.04487 | 8587 | 8469 |
| 165 | 4 | 2 | 4 | 94.999 | 1.04477 | 1156 | 1143 |
| 166 | 1 | 3 | 4 | 95.032 | 1.0445 | 609 | 602 |
| 167 | 9 | 1 | 1 | 95.139 | 1.0462 | 4016 | 3962 |
| 168 | 6 | 4 | 1 | 95.238 | 1.04537 | 4108 | 4058 |
| 169 | 5 | 1 | 4 | 95.29 | 1.04494 | 195 | 192 |
| 170 | 3 | 5 | 1 | 95.298 | 1.04487 | 4269 | 4204 |
| 171 | 4 | 2 | 4 | 95.31 | 1.04477 | 575 | 567 |
| 172 | 1 | 3 | 4 | 95.344 | 1.0445 | 304 | 299 |
| 173 | 8 | 2 | 2 | 97.156 | 1.02724 | 533 | 515 |
| 174 | 7 | 3 | 2 | 97.189 | 1.02697 | 983 | 946 |
| 175 | 1 | 5 | 2 | 97.296 | 1.02613 | 878 | 840 |
| 176 | 8 | 2 | 2 | 97.479 | 1.02724 | 264 | 256 |
| 177 | 7 | 3 | 2 | 97.513 | 1.02697 | 482 | 470 |
| 178 | 1 | 5 | 2 | 97.62 | 1.02613 | 426 | 417 |
| 179 | 6 | 0 | 4 | 100.691 | 1.00049 | 5749 | 5826 |
| 180 | 3 | 3 | 4 | 100.751 | 1.00005 | 7565 | 7696 |
| 181 | 6 | 0 | 4 | 101.035 | 1.00049 | 2904 | 2897 |
| 182 | 3 | 3 | 4 | 101.096 | 1.00005 | 3864 | 3826 |
| 183 | 1 | 1 | 5 | 101.945 | 0.99155 | 99 | 95 |
| 184 | 4 | 4 | 3 | 102.075 | 0.99064 | 700 | 665 |
| 185 | 1 | 1 | 5 | 102.297 | 0.99155 | 50 | 47 |
| 186 | 4 | 4 | 3 | 102.428 | 0.99064 | 353 | 331 |
| 187 | 9 | 1 | 2 | 102.889 | 0.98501 | 2904 | 2773 |
| 188 | 6 | 4 | 2 | 102.99 | 0.98431 | 1613 | 1539 |
| 189 | 3 | 5 | 2 | 103.051 | 0.9839 | 2352 | 2255 |
| 190 | 9 | 1 | 2 | 103.247 | 0.98501 | 1414 | 1379 |

TABLE 4-continued

| Peak No. | h | k | l | 2θ degree | Spacing Å | Observed intensity arbitrary unit | Calculated intensity arbitrary unit |
|---|---|---|---|---|---|---|---|
| 191 | 6 | 4 | 2 | 103.349 | 0.98431 | 774 | 766 |
| 192 | 3 | 5 | 2 | 103.41 | 0.9839 | 1122 | 1122 |
| 193 | 10 | 0 | 0 | 103.617 | 0.98007 | 899 | 903 |
| 194 | 5 | 5 | 0 | 103.786 | 0.97893 | 803 | 806 |
| 195 | 10 | 0 | 0 | 103.979 | 0.98007 | 451 | 449 |
| 196 | 5 | 5 | 0 | 104.15 | 0.97893 | 411 | 401 |
| 197 | 5 | 5 | 1 | 106.535 | 0.96113 | 323 | 378 |
| 198 | 5 | 5 | 1 | 106.917 | 0.96113 | 183 | 188 |
| 199 | 3 | 1 | 5 | 107.807 | 0.95329 | 6210 | 6468 |
| 200 | 0 | 2 | 5 | 107.827 | 0.95316 | 3757 | 3932 |

Results of X-ray diffraction (No. 5)

| Peak No. | h | k | l | 2θ degree | Spacing Å | Observed intensity arbitrary unit | Calculated intensity arbitrary unit |
|---|---|---|---|---|---|---|---|
| 201 | 3 | 1 | 5 | 108.198 | 0.95329 | 3120 | 3223 |
| 202 | 0 | 2 | 5 | 108.219 | 0.95316 | 1888 | 1959 |
| 203 | 6 | 2 | 4 | 109.525 | 0.94308 | 3209 | 2974 |
| 204 | 9 | 3 | 0 | 109.591 | 0.9427 | 3570 | 3280 |
| 205 | 0 | 4 | 4 | 109.609 | 0.9426 | 656 | 602 |
| 206 | 0 | 6 | 0 | 109.779 | 0.94161 | 1454 | 1338 |
| 207 | 6 | 2 | 4 | 109.93 | 0.94308 | 1622 | 1483 |
| 208 | 9 | 3 | 0 | 109.995 | 0.9427 | 1792 | 1636 |
| 209 | 0 | 4 | 4 | 110.014 | 0.9426 | 329 | 300 |
| 210 | 0 | 6 | 0 | 110.185 | 0.94161 | 731 | 667 |
| 211 | 2 | 2 | 5 | 110.828 | 0.93563 | 247 | 223 |
| 212 | 8 | 2 | 3 | 110.859 | 0.93546 | 1336 | 1210 |
| 213 | 7 | 3 | 3 | 110.894 | 0.93526 | 103 | 93 |
| 214 | 1 | 5 | 3 | 111.007 | 0.93463 | 519 | 457 |
| 215 | 2 | 2 | 5 | 111.242 | 0.93563 | 119 | 111 |
| 216 | 8 | 2 | 3 | 111.273 | 0.93546 | 647 | 604 |
| 217 | 7 | 3 | 3 | 111.308 | 0.93526 | 49 | 46 |
| 218 | 1 | 5 | 3 | 111.422 | 0.93463 | 246 | 228 |
| 219 | 9 | 3 | 1 | 112.432 | 0.92677 | 457 | 453 |
| 220 | 7 | 1 | 4 | 112.538 | 0.9262 | 96 | 97 |
| 221 | 10 | 2 | 0 | 112.59 | 0.92592 | 528 | 532 |
| 222 | 5 | 3 | 4 | 112.595 | 0.9259 | 832 | 826 |
| 223 | 0 | 6 | 1 | 112.625 | 0.92574 | 381 | 385 |
| 224 | 2 | 4 | 4 | 112.645 | 0.92563 | 174 | 173 |
| 225 | 8 | 4 | 0 | 112.676 | 0.92546 | 1400 | 1394 |
| 226 | 2 | 6 | 0 | 112.819 | 0.92469 | 115 | 117 |
| 227 | 9 | 3 | 1 | 112.859 | 0.92677 | 222 | 226 |
| 228 | 7 | 1 | 4 | 112.966 | 0.9262 | 47 | 48 |
| 229 | 10 | 2 | 0 | 113.018 | 0.92592 | 261 | 265 |
| 230 | 5 | 3 | 4 | 113.023 | 0.9259 | 405 | 412 |
| 231 | 0 | 6 | 1 | 113.053 | 0.92574 | 188 | 192 |
| 232 | 2 | 4 | 4 | 113.074 | 0.92563 | 86 | 87 |
| 233 | 8 | 4 | 0 | 113.105 | 0.92546 | 688 | 696 |
| 234 | 2 | 6 | 0 | 113.249 | 0.92469 | 56 | 59 |
| 235 | 10 | 0 | 2 | 114.874 | 0.91396 | 1273 | 1144 |
| 236 | 5 | 5 | 2 | 115.055 | 0.91303 | 1086 | 961 |
| 237 | 10 | 0 | 2 | 115.321 | 0.91396 | 627 | 571 |
| 238 | 10 | 2 | 1 | 115.495 | 0.91081 | 149 | 143 |
| 239 | 5 | 5 | 2 | 115.504 | 0.91303 | 501 | 480 |
| 240 | 8 | 4 | 1 | 115.583 | 0.91038 | 71 | 69 |
| 241 | 2 | 6 | 1 | 115.729 | 0.90965 | 825 | 800 |
| 242 | 10 | 2 | 1 | 115.948 | 0.91081 | 76 | 71 |
| 243 | 8 | 4 | 1 | 116.036 | 0.91038 | 36 | 34 |
| 244 | 2 | 6 | 1 | 116.184 | 0.90965 | 418 | 400 |
| 245 | 9 | 1 | 3 | 117.036 | 0.90323 | 3785 | 3707 |
| 246 | 6 | 4 | 3 | 117.147 | 0.9027 | 6351 | 6249 |
| 247 | 3 | 5 | 3 | 117.214 | 0.90238 | 8809 | 8688 |
| 248 | 9 | 1 | 3 | 117.503 | 0.90323 | 1876 | 1854 |
| 249 | 6 | 4 | 3 | 117.615 | 0.9027 | 3153 | 3125 |
| 250 | 3 | 5 | 3 | 117.682 | 0.90238 | 4393 | 4345 |

Results of X-ray diffraction (No. 6)

| Peak No. | h | k | l | 2θ degree | Spacing Å | Observed intensity arbitrary unit | Calculated intensity arbitrary unit |
|---|---|---|---|---|---|---|---|
| 251 | 5 | 1 | 5 | 120.23 | 0.88842 | 190 | 173 |
| 252 | 4 | 2 | 5 | 120.253 | 0.88831 | 1117 | 1030 |
| 253 | 1 | 3 | 5 | 120.291 | 0.88814 | 215 | 197 |
| 254 | 5 | 1 | 5 | 120.727 | 0.88842 | 92 | 87 |
| 255 | 4 | 2 | 5 | 120.751 | 0.88831 | 556 | 516 |
| 256 | 1 | 3 | 5 | 120.789 | 0.88814 | 107 | 99 |
| 257 | 9 | 3 | 2 | 121.365 | 0.88343 | 9276 | 8712 |
| 258 | 0 | 6 | 2 | 121.573 | 0.88253 | 3149 | 2999 |
| 259 | 9 | 3 | 2 | 121.874 | 0.88343 | 4581 | 4365 |
| 260 | 0 | 6 | 2 | 122.085 | 0.88253 | 1548 | 1503 |
| 261 | 8 | 0 | 4 | 122.102 | 0.88027 | 825 | 792 |
| 262 | 11 | 1 | 0 | 122.144 | 0.88009 | 48 | 46 |
| 263 | 4 | 4 | 4 | 122.227 | 0.87974 | 1161 | 1113 |
| 264 | 7 | 5 | 0 | 122.331 | 0.8793 | 55 | 53 |
| 265 | 4 | 6 | 0 | 122.416 | 0.87894 | 35 | 34 |
| 266 | 8 | 0 | 4 | 122.619 | 0.88027 | 411 | 397 |
| 267 | 11 | 1 | 0 | 122.661 | 0.88009 | 23 | 23 |
| 268 | 4 | 4 | 4 | 122.745 | 0.87974 | 570 | 558 |
| 269 | 7 | 5 | 0 | 122.85 | 0.8793 | 27 | 26 |
| 270 | 4 | 6 | 0 | 122.937 | 0.87894 | 17 | 17 |
| 271 | 10 | 2 | 2 | 124.703 | 0.86958 | 1189 | 1160 |
| 272 | 8 | 4 | 2 | 124.8 | 0.86919 | 1867 | 1838 |
| 273 | 2 | 6 | 2 | 124.96 | 0.86856 | 465 | 456 |
| 274 | 10 | 2 | 2 | 125.249 | 0.86958 | 604 | 582 |
| 275 | 11 | 1 | 1 | 125.334 | 0.86709 | 855 | 833 |
| 276 | 8 | 4 | 2 | 125.347 | 0.86919 | 947 | 923 |
| 277 | 2 | 6 | 2 | 125.509 | 0.86856 | 234 | 229 |
| 278 | 7 | 5 | 1 | 125.528 | 0.86633 | 30 | 29 |
| 279 | 4 | 6 | 1 | 125.617 | 0.86599 | 2025 | 1984 |
| 280 | 11 | 1 | 1 | 125.888 | 0.86709 | 430 | 418 |
| 281 | 7 | 5 | 1 | 126.084 | 0.86633 | 15 | 15 |
| 282 | 4 | 6 | 1 | 126.174 | 0.86599 | 1035 | 996 |
| 283 | 3 | 3 | 5 | 127.101 | 0.86033 | 236 | 232 |
| 284 | 3 | 3 | 5 | 127.677 | 0.86033 | 128 | 117 |

TABLE 5

Data of crystal structure of CaAlSiN3

CaAlSiN3
Space Group (#36) Cmc2$_1$
Lattice constants (Å)

| a | b | c |
|---|---|---|
| 9.8007 (4) | 5.6497 (2) | 5.0627 (2) |

| Site | | x | y | z |
|---|---|---|---|---|
| Si/Al | 8 (b) | 0.1734 (2) | 0.1565 (3) | 0.0504 (4) |
| N1 | 8 (b) | 0.2108 (4) | 0.1205 (8) | 0.3975 (7) |
| N2 | 4 (a) | 0 | 0.2453 (7) | 0.0000 (10) |
| Ca | 4 (a) | 0 | 0.3144 (3) | 0.5283 |

SiN2O
Space Group (#36) Cmc2$_1$
Lattice constants (Å)

| a | b | c |
|---|---|---|
| 8.8717 | 5.4909 | 4.8504 |

| Site | | x | y | z |
|---|---|---|---|---|
| Si/Al | 8 (b) | 0.1767 | 0.1511 | 0.0515 |
| N | 8 (b) | 0.2191 | 0.1228 | 0.3967 |
| O | 4 (a) | 0 | 0.2127 | 0 |

TABLE 6

Peak wavelength and intensity of excitation emission spectra

| Example | Emission intensity arbitrary unit | Emission wavelength nm | Excitation intensity arbitrary unit | Excitation wavelength nm |
|---|---|---|---|---|
| 1 | 10655 | 653 | 10595 | 449 |
| 2 | 622 | 600 | 617 | 449 |

TABLE 6-continued

Peak wavelength and intensity of excitation emission spectra

| Example | Emission intensity arbitrary unit | Emission wavelength nm | Excitation intensity arbitrary unit | Excitation wavelength nm |
|---|---|---|---|---|
| 3  | 2358 | 655 | 2336 | 449 |
| 4  | 4492 | 655 | 4471 | 449 |
| 5  | 5985 | 655 | 5975 | 449 |
| 6  | 6525 | 654 | 6464 | 449 |
| 7  | 6796 | 654 | 6748 | 449 |
| 8  | 8457 | 654 | 8347 | 449 |
| 9  | 8384 | 650 | 8278 | 449 |
| 10 | 7591 | 650 | 7486 | 449 |
| 11 | 7368 | 645 | 7264 | 449 |
| 12 | 7924 | 641 | 7834 | 449 |
| 13 | 8019 | 637 | 7920 | 449 |
| 14 | 8174 | 629 | 8023 | 449 |
| 15 | 1554 | 679 | 1527 | 401 |
| 16 | 8843 | 657 | 8779 | 449 |
| 17 | 5644 | 658 | 5592 | 449 |
| 18 | 6189 | 658 | 6199 | 449 |
| 19 | 5332 | 657 | 5261 | 449 |
| 20 | 5152 | 661 | 5114 | 449 |
| 21 | 4204 | 663 | 4177 | 449 |
| 22 | 3719 | 667 | 3710 | 449 |
| 23 | 3800 | 664 | 3833 | 449 |
| 24 | 2090 | 679 | 2097 | 449 |
| 25 | 322  | 679 | 326  | 453 |

Comparative Example 1

Using the raw powders described in Example 1, in order to obtain pure CaAlSiN$_3$ containing no M Element, the silicon nitride powder, the aluminum nitride powder, and the calcium nitride powder were weighed so as to be 34.088% by weight, 29.883% by weight, and 36.029% by weight, respectively, and a powder was prepared in the same manner as in Example 1. According to the measurement of X-ray diffraction, it was confirmed that the synthesized powder was CaAlSiN$_3$. When excitation and emission spectra of the synthesized inorganic compound were measured, any remarkable emission peak was not observed in the range of 570 nm to 700 nm.

Examples 2 to 7

As Examples 2 to 7 were prepared inorganic compounds having a composition in which part or all of Ca was replaced with Ba.

Figure 4:
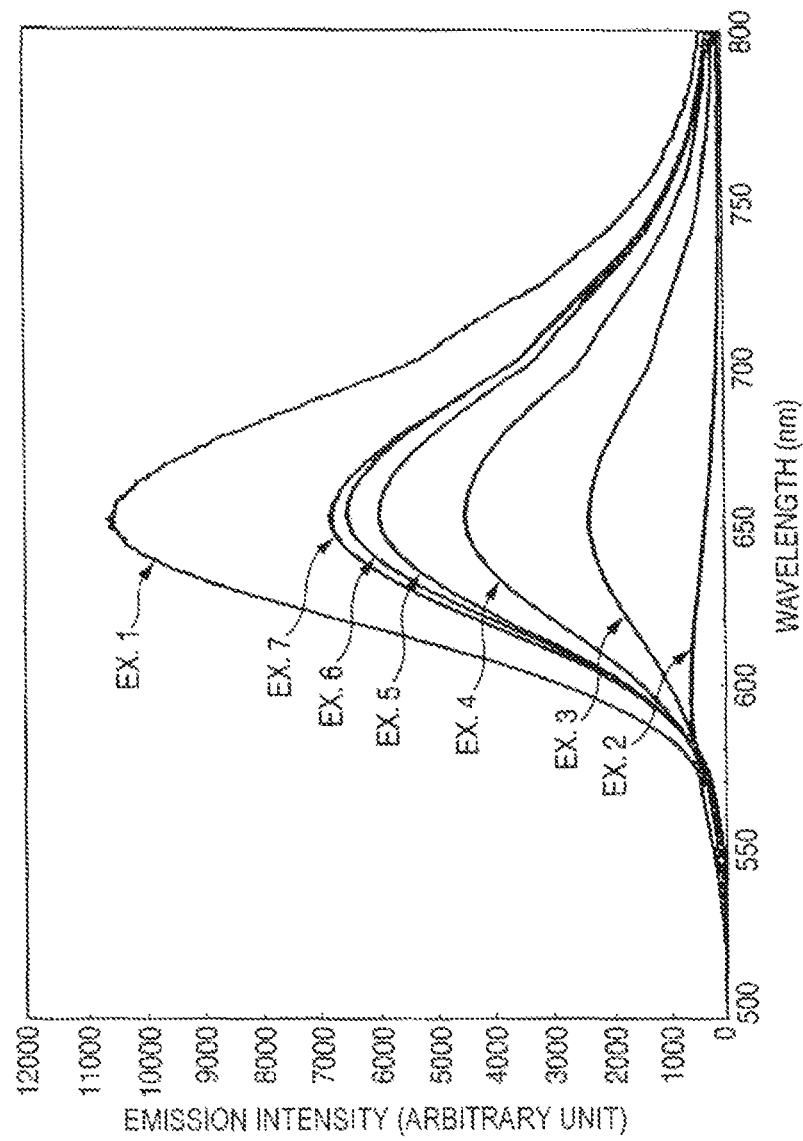
FIG. 4 is a drawing illustrating emission spectra of phosphors (Examples 1 to 7).
Figure 5:
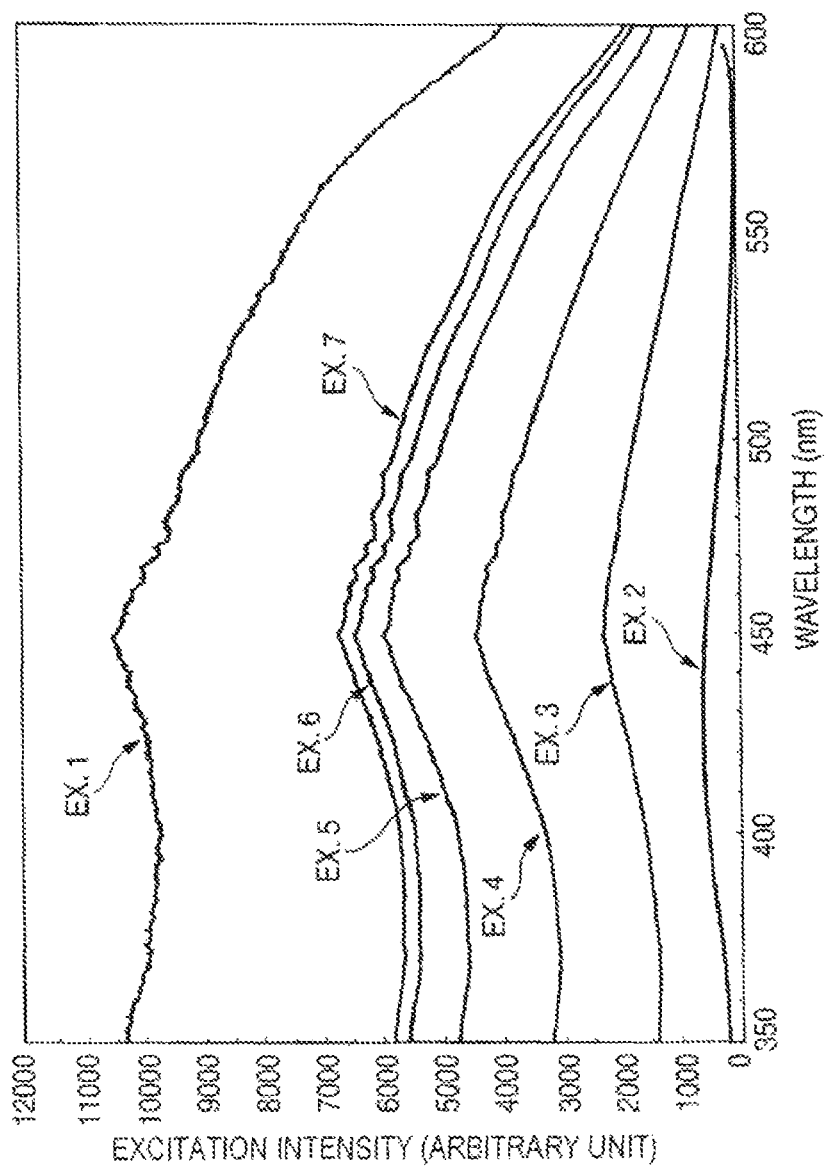
FIG. 5 is a drawing illustrating excitation spectra of phosphors (Examples 1 to 7).

The inorganic compounds were prepared in the same manner as in Example 1 with the exception of the compositions shown in Tables 1, 2, and 3. According to the measurement of X-ray diffraction, it was confirmed that the synthesized powders were inorganic compounds having the same crystal structure as that of CaAlSiN$_3$. When excitation and emission spectra of the synthesized inorganic compound were measured, as shown in FIGS. 4 and 5, and Table 6, it was confirmed that they were red phosphors having an emission peak in the range of 570 nm to 700 nm, which were excited with an ultraviolet ray or a visible light of 350 nm to 600 nm. Incidentally, since emission luminance decreases as an added amount of Ba increases, a composition in the region where the added amount of Ba is small is preferred.

Examples 8 to 15

As Examples 8 to 15 were prepared inorganic compounds having a composition in which part or all of Ca was replaced with Sr.

Figure 6:
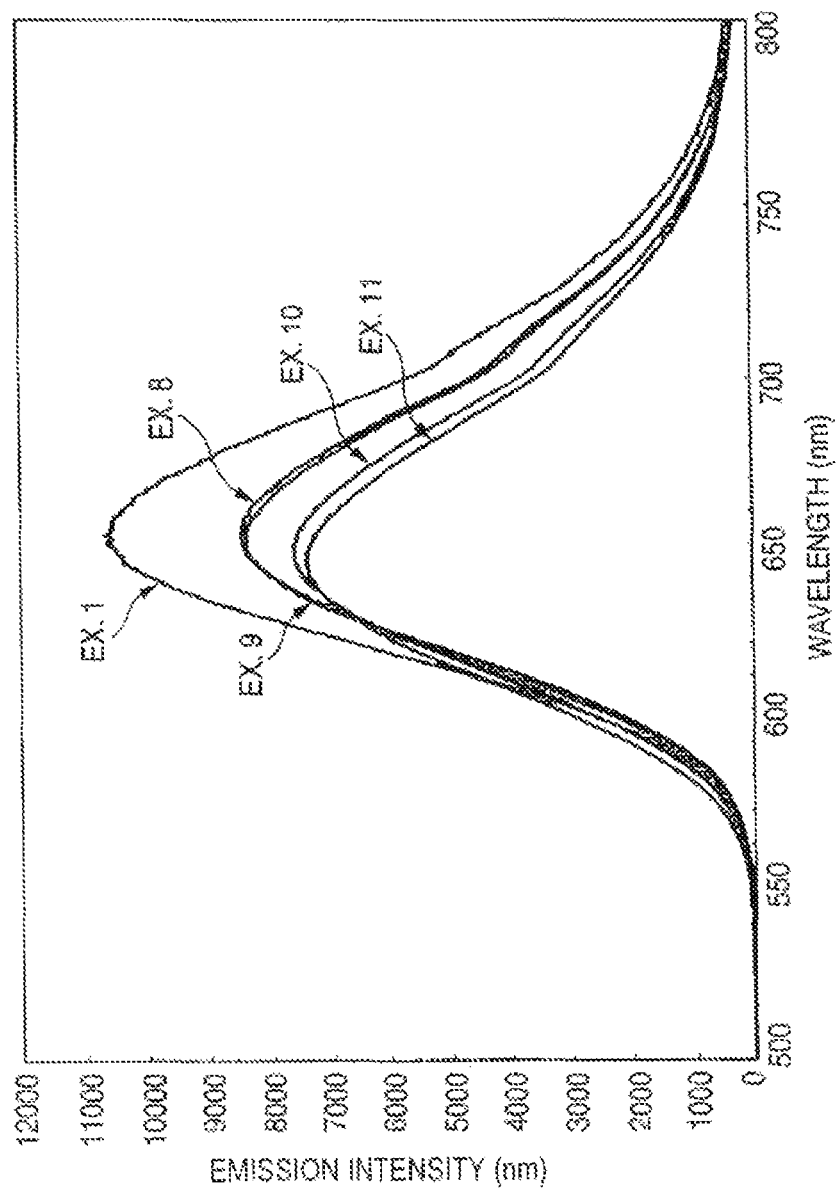
FIG. 6 is a drawing illustrating emission spectra of phosphors (Examples 8 to 11).
Figure 7:
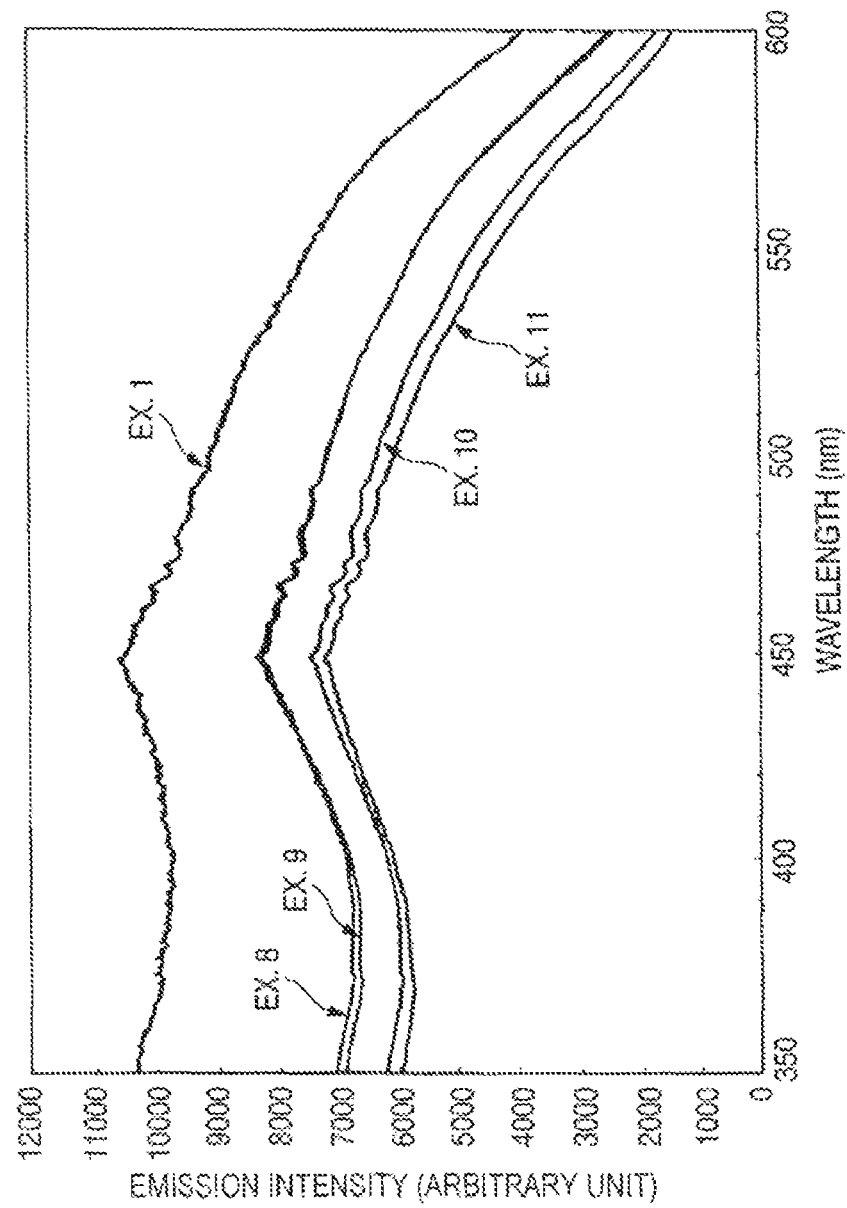
FIG. 7 is a drawing illustrating excitation spectra of phosphors (Examples 8 to 11).
Figure 8:
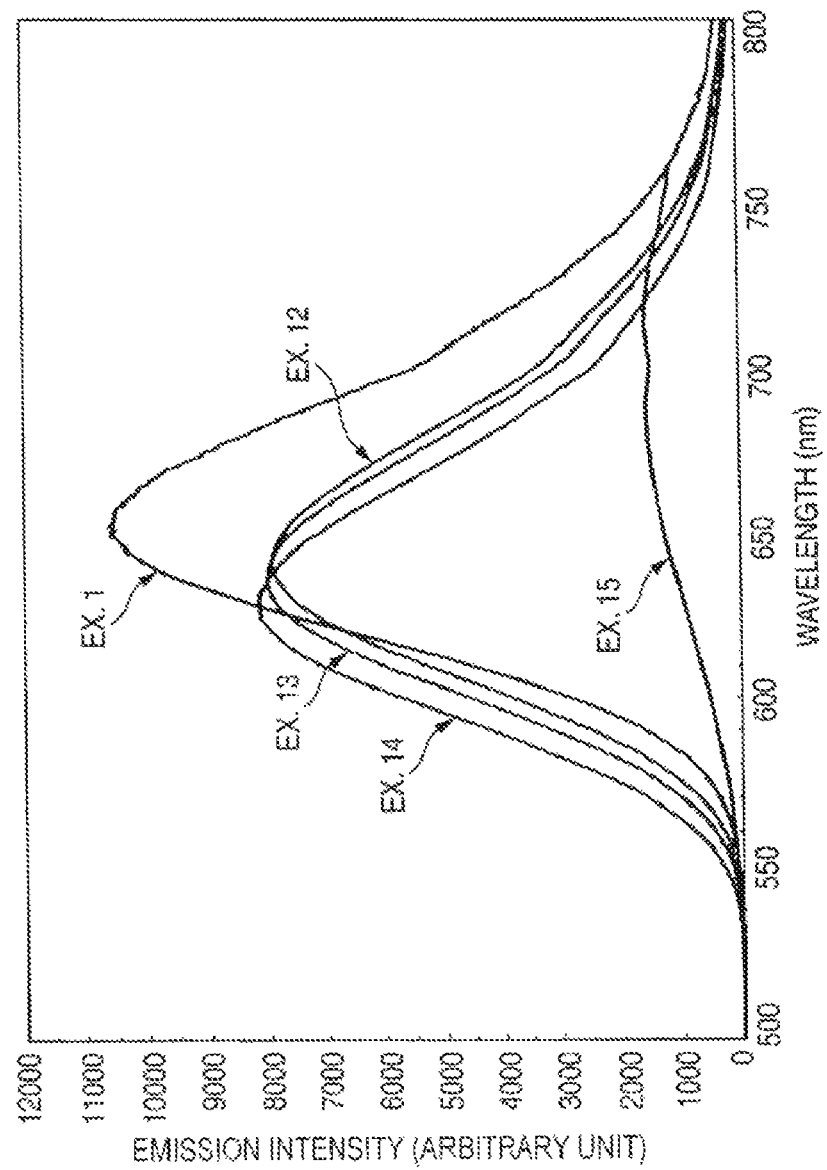
FIG. 8 is a drawing illustrating emission spectra of phosphors (Examples 12 to 15).
Figure 9:
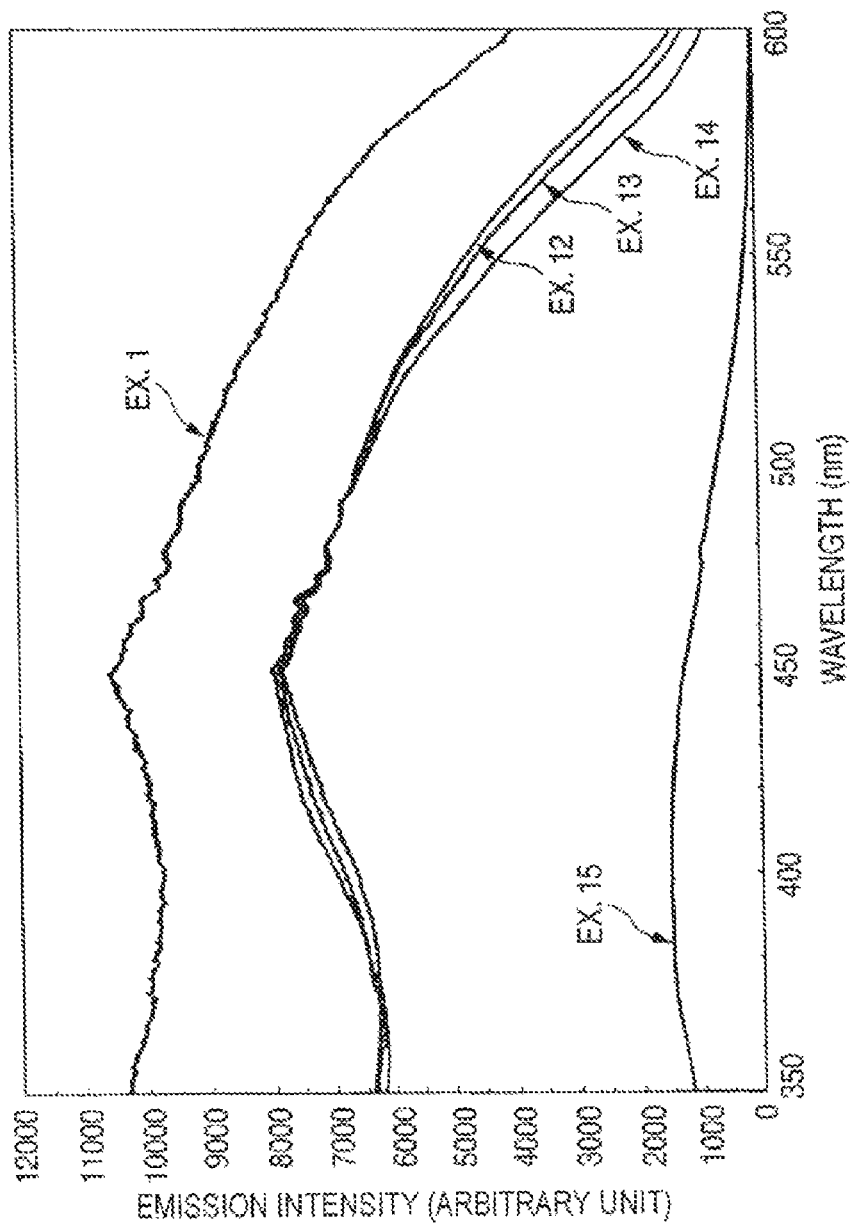
FIG. 9 is a drawing illustrating excitation spectra of phosphors (Examples 12 to 15).

Phosphors were prepared in the same manner as in Example 1 with the exception of the compositions shown in Tables 1, 2, and 3. According to the measurement of X-ray diffraction, it was confirmed that the synthesized powders were inorganic compounds having the same crystal structure as that of CaAlSiN$_3$. When excitation and emission spectra of the synthesized inorganic compound. were measured, as shown in FIGS. 6 and 7 (Examples 8 to 11), FIGS. 8 and 9 (Examples 12 to 15), and Table 6, it was confirmed that they were red phosphors having an emission peak in the range of 570 nm to 700 nm, which were excited with an ultraviolet ray or a visible light of 350 nm to 600 nm. Incidentally, emission luminance decreases as an added amount of Sr increases, but the wavelength of the emission peak shifts to a shorter wavelength side as compared with the addition of Ca alone. Therefore, in the case that it is desired to obtain a phosphor having a peak wavelength in the range of 600 nm to 650 nm, it is effective to replace part of Ca with Sr.

Examples 16 to 25

As Examples 16 to 25 were prepared inorganic compounds having a composition in which part or all of Ca was replaced with Mg.

Figure 10:
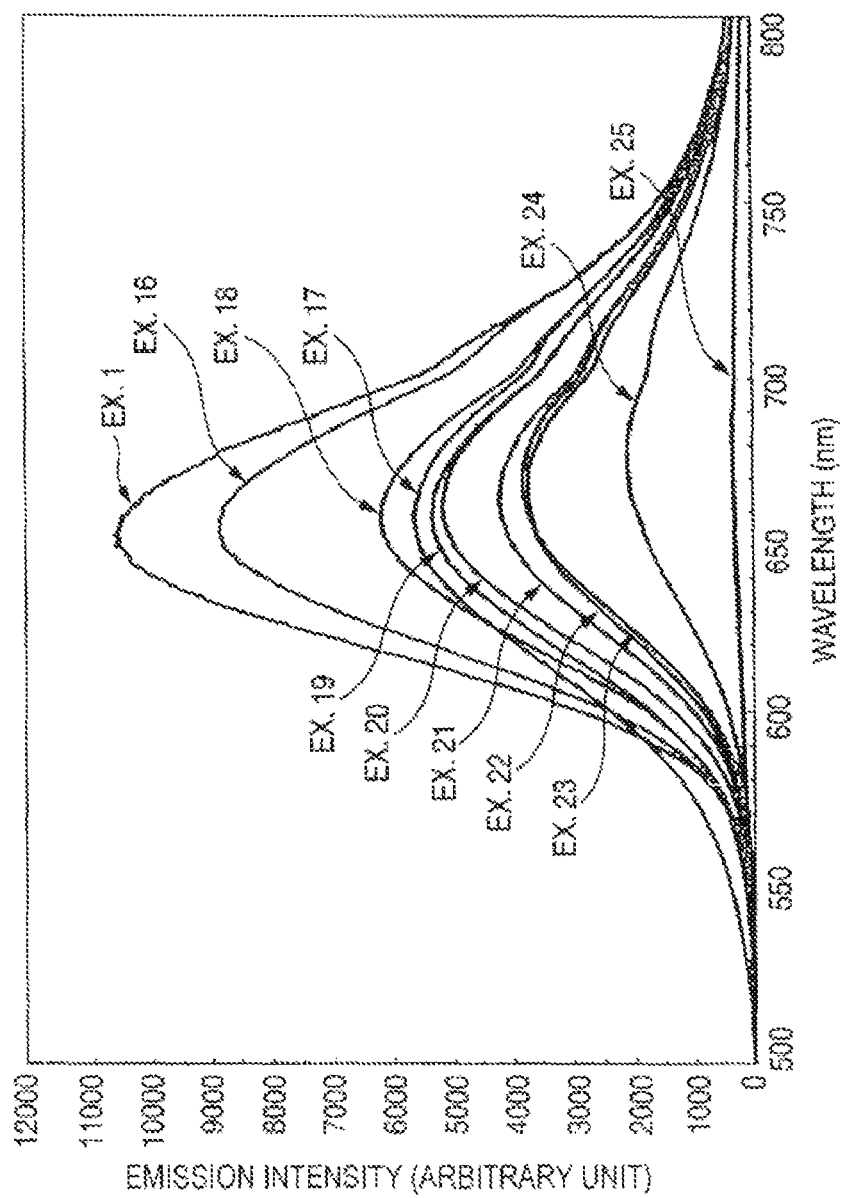
FIG. 10 is a drawing illustrating emission spectra of phosphors (Examples 16 to 25).
Figure 11:
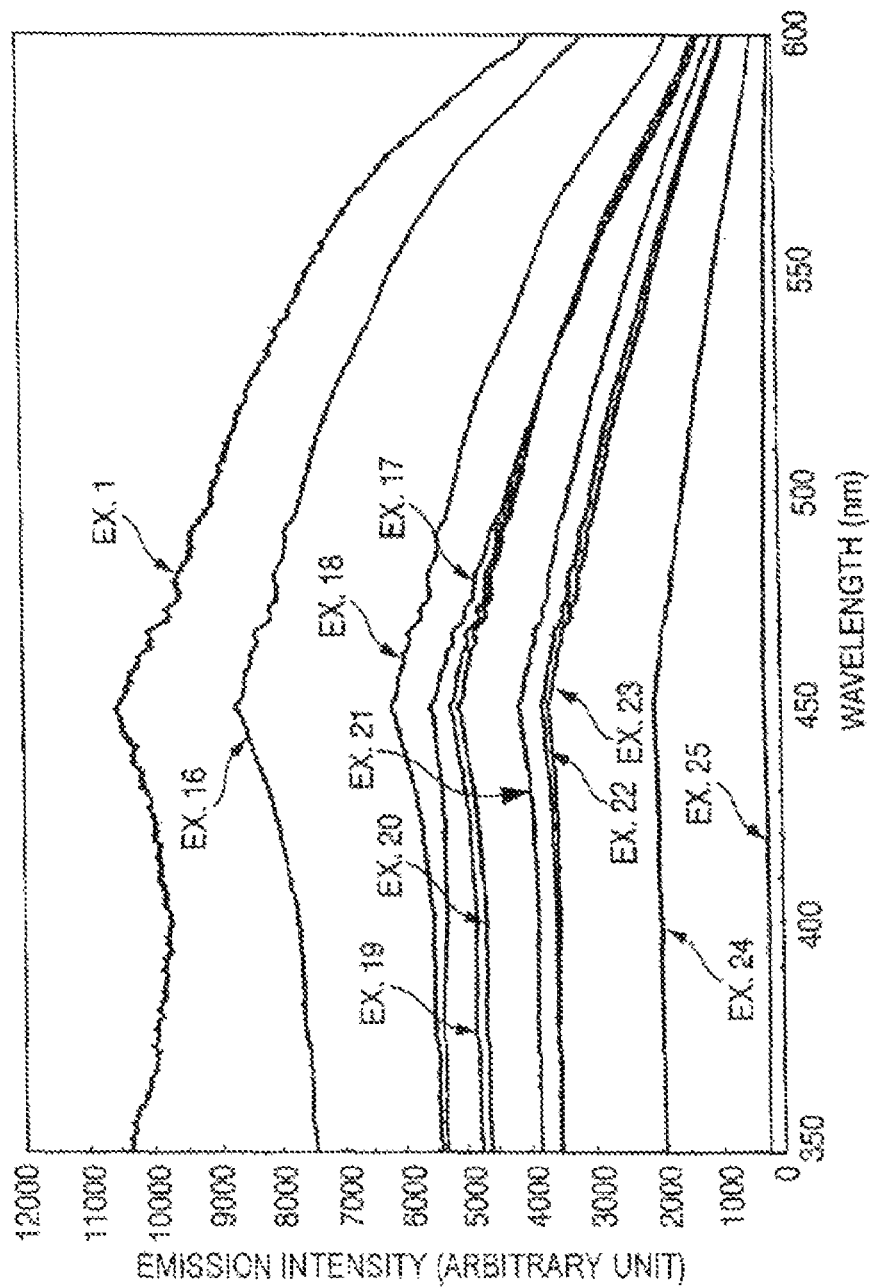
FIG. 11 is a drawing illustrating excitation spectra of phosphors (Examples 16 to 25).

Phosphors were prepared in the same manner as in Example 1 with the exception of the compositions shown in Tables 1, 2, and 3. According to the measurement of X-ray diffraction, it was confirmed that the synthesized powders were inorganic compounds having the same crystal structure as that of CaAlSiN$_3$. When excitation and emission spectra of the synthesized inorganic compound were measured, as shown in FIGS. 10 and 11, and Table 6, it was confirmed that they were red phosphors having an emission peak in the range of 570 nm to 700 nm, which were excited with an ultraviolet ray or a visible light of 350 nm to 600 nm. Incidentally, since emission luminance decreases as an added amount of Mg increases, a composition in the region where the added amount of Mg is small is preferred.

Examples 26 to 30

As Examples 26 to 30 were prepared inorganic compounds having a composition in which part of N was replaced with O. In this case, since valence number is different between N and O, simple replacement does not result in neutrality of the total charge. Thus, the composition:

$$Ca_6Si_{6-x}Al_{6+x}O_xN_{18-x}(0<x\leq 3)$$

was investigated, which is a composition in which Si—N is replaced with Al—O.

Figure 12:
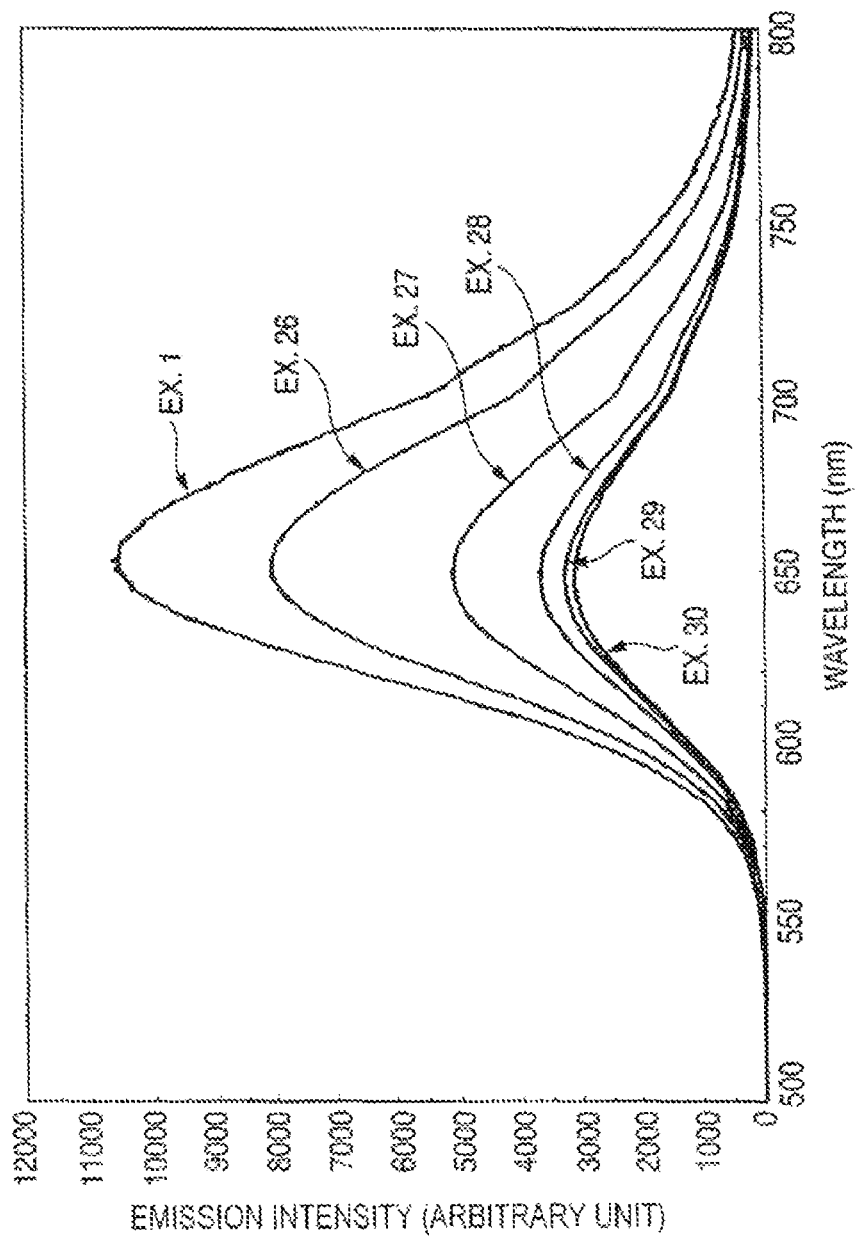
FIG. 12 is a drawing illustrating emission spectra of phosphors (Examples 26 to 30).
Figure 13:
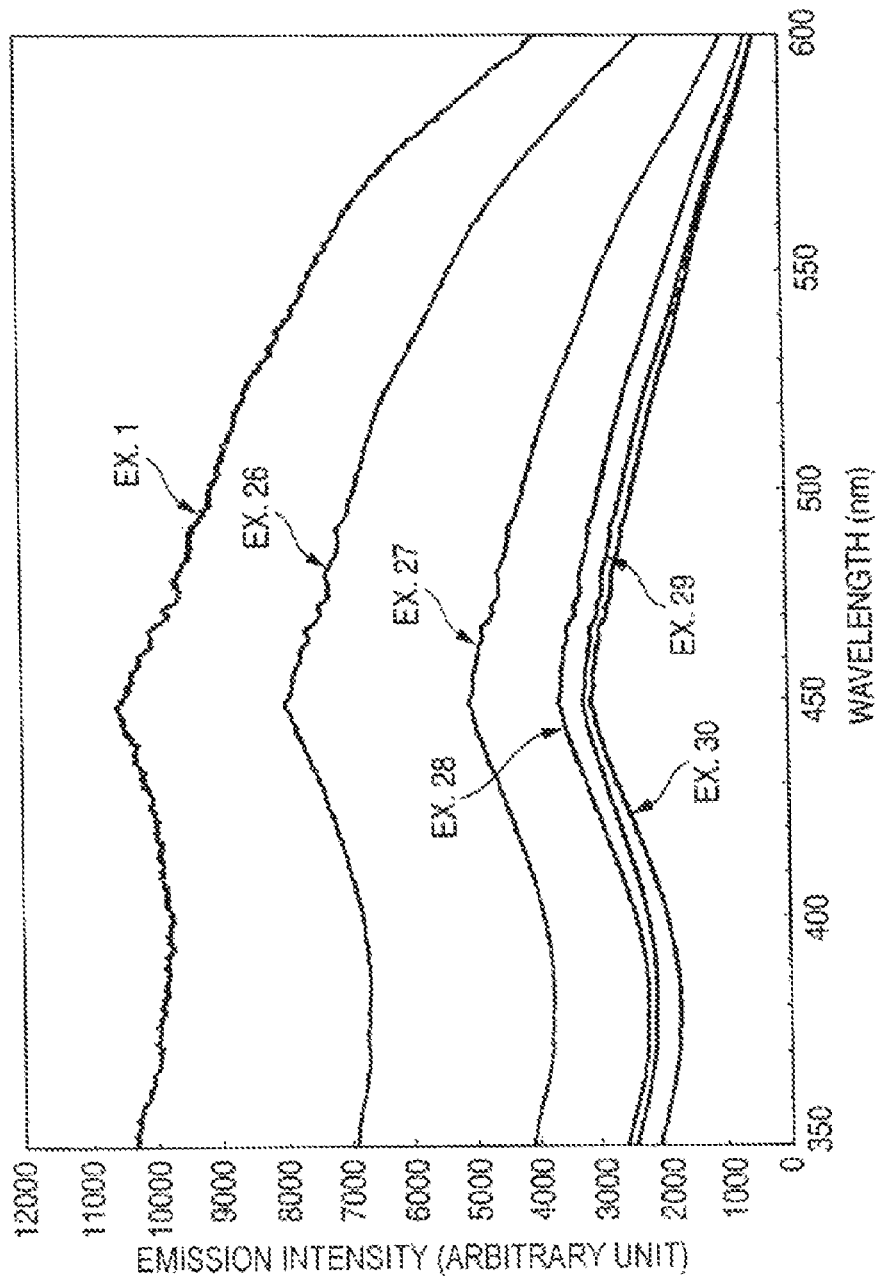
FIG. 13 is a drawing illustrating excitation spectra of phosphors (Examples 26 to 30).

Phosphors were prepared in the same manner as in Example 1 with the exception of the compositions shown in Tables 7 and 8. According to the measurement of X-ray diffraction, it was confirmed that the synthesized powders were inorganic compounds having the same crystal structure as that of CaAlSiN$_3$. When excitation and emission spectra of the synthesized inorganic compound were measured, as shown in FIGS. 12 and 13, it was confirmed that they were red phosphors having an emission peak in the range of 570 nm to 700 nm, which were excited with an ultraviolet ray or a visible light of 350 nm to 600 nm. Incidentally, since emission luminance decreases as an added amount of oxygen increases, a composition in the region where the added amount of oxygen is small is preferred.

TABLE 7

Parameters for designed composition

| Example | M Element Eu a Value | A Element Ca b Value | D Element Si c Value | E Element Al d Value | X Element O e Value | X Element N |
|---|---|---|---|---|---|---|
| 26 | 0.008 | 0.992 | 0.916667 | 1.083333 | 0.083333 | 2.919333 |
| 27 | 0.008 | 0.992 | 0.833333 | 1.166667 | 0.166667 | 2.836 |
| 28 | 0.008 | 0.992 | 0.75 | 1.25 | 0.25 | 2.752667 |
| 29 | 0.008 | 0.992 | 0.666667 | 1.333333 | 0.333333 | 2.669333 |
| 30 | 0.008 | 0.992 | 0.5 | 1.5 | 0.5 | 2.502667 |

TABLE 8

Mixing composition (% by weight)

| Example | Si3N4 | AlN | Al2O3 | Ca3N2 | EuN |
|---|---|---|---|---|---|
| 26 | 31.02 | 30.489 | 2.05 | 35.48 | 0.961 |
| 27 | 28.184 | 31.297 | 4.097 | 35.461 | 0.96 |
| 28 | 25.352 | 32.103 | 6.143 | 35.442 | 0.96 |
| 29 | 22.523 | 32.908 | 8.186 | 35.423 | 0.959 |
| 30 | 16.874 | 34.517 | 12.266 | 35.385 | 0.958 |

TABLE 9

Mixing composition of raw powder (unit: % by weight)

| | Si3N4 | AlN | Ca3N2 | EuN |
|---|---|---|---|---|
| Example 31 | 34.07348 | 29.870475 | 35.995571 | 0.060475 |
| Example 32 | 34.059016 | 29.857795 | 35.962291 | 0.120898 |
| Example 33 | 34.030124 | 29.832467 | 35.895818 | 0.241591 |
| Example 34 | 33.518333 | 29.383806 | 34.718285 | 2.379577 |
| Example 35 | 33.185606 | 29.092121 | 33.952744 | 3.769529 |
| Example 36 | 32.434351 | 28.433534 | 32.224251 | 6.907864 |
| Example 37 | 31.418284 | 27.542801 | 29.886478 | 11.152437 |

Examples 31 to 37

Using the same raw powders as in Example 1, in order to obtain inorganic compounds (showing mixing compositions of the raw powders in Table 9 and composition parameters in Table 10), the silicon nitride powder, the aluminum nitride powder, the calcium nitride powder, and the europium nitride powder were weighed, followed by 30 minutes of mixing by means of an agate mortar and pestle. Thereafter, the resulting mixture was molded using a mold by applying a pressure of 20 MPa to form a molded article having a diameter of 12 mm and a thickness of 5 mm. In this connection, respective steps of weighing, mixing, and molding of the powders were all conducted in a globe box capable of maintaining a nitrogen atmosphere having a moisture content of 1 ppm or less and an oxygen content of 1 ppm or less.

The molded article was placed in a crucible made of boron nitride and set in a graphite resistive heating-type electric furnace. The baking operations were conducted as follows: the baking atmosphere was first vacuumed by a diffusion pump, heated from warm room to 800° C. at a rate of 500° C. per hour, and pressurized to 1 MPa by introducing nitrogen having a purity of 99.999% by volume at 800° C., and the temperature was elevated to 1800° C. at a rate of 500° C. per hour and held at 1800° C. for 2 hours.

After baking, as a result of identification of constitutive crystal phase of the resulting sintered compact, it was judged to be a $CaAlSiN_3$ family crystal phase. As a result of irradiation of the powder with a lamp emitting a light having a wavelength of 365 nm, it was confirmed that it emits a red light. When excitation spectrum and emission spectrum of the powder were measured using a fluorescence spectrophotometer, as shown in Table 11, it was confirmed that it was a red phosphor having an emission peak in the range of 570 nm to 700 nm, which was excited with an ultraviolet ray or a visible light of 350 nm to 600 nm. Incidentally, since the measurement in these Examples was conducted using an apparatus different from that used in other Examples, the count values can be compared only within the range of Examples 31 to 37.

TABLE 10

Parameters for designed composition

| | a(Eu) | b(Ca) | c(Si) | d(Al) | e(N) |
|---|---|---|---|---|---|
| Example 31 | 0.0005 | 0.9995 | 1 | 1 | 3 |
| Example 32 | 0.001 | 0.999 | 1 | 1 | 3 |
| Example 33 | 0.002 | 0.998 | 1 | 1 | 3 |
| Example 34 | 0.02 | 0.98 | 1 | 1 | 3 |
| Example 35 | 0.032 | 0.968 | 1 | 1 | 3 |
| Example 36 | 0.06 | 0.94 | 1 | 1 | 3 |
| Example 37 | 0.1 | 0.9 | 1 | 1 | 3 |

TABLE 11

Peak wavelength and intensity of excitation and emission spectra on fluorescence measurement

| | Excitation spectrum | | Emission spectrum | |
|---|---|---|---|---|
| | Peak wavelength nm | Intensity arbitrary unit | Peak wavelength nm | Intensity arbitrary unit |
| Example 31 | 479.6 | 387.322 | 609.2 | 391.066 |
| Example 32 | 472.8 | 374.967 | 609.2 | 375.33 |
| Example 33 | 480 | 427.41 | 612.6 | 428.854 |
| Example 34 | 538 | 412.605 | 626.8 | 411.394 |
| Example 35 | 546.4 | 414.434 | 629.2 | 413.009 |
| Example 36 | 549.8 | 181.127 | 638.8 | 180.981 |
| Example 37 | 549.4 | 89.023 | 644.4 | 92.763 |

Examples 38 to 56 and 60 to 76

As Examples 38 to 56 and 60 to 76 were prepared inorganic compounds having compositions in which c, d, and e parameters in the $Eu_aCa_bSi_cAl_dN_e$ composition were changed.

Phosphors were prepared in the same manner as in Example 1 with the exception of the compositions shown in Tables 12 and 13. According to the measurement of X-ray diffraction, it was confirmed that; the synthesized powders were powders containing inorganic compounds having the same crystal structure as that of $CaAlSiN_3$. When excitation and emission spectra of the synthesized inorganic compound were measured, as shown in Table 14, it was confirmed that they were red phosphors having an emission peak in the range of 570 nm to 700 nm, which were excited with an ultraviolet ray or a visible light of 350 nm to 600 nm.

TABLE 12

Parameters for designed composition

| Example | a Value (Eu) | b Value (Ca) | c Value (Si) | d Value (Al) | e Value (N) |
|---|---|---|---|---|---|
| 38 | 0.002 | 0.998 | 1 | 1 | 3 |
| 39 | 0.004 | 0.996 | 1 | 1 | 3 |
| 40 | 0.008 | 0.992 | 1 | 1 | 3 |
| 41 | 0.01 | 0.99 | 1 | 1 | 3 |
| 42 | 0.06 | 0.94 | 1 | 1 | 3 |
| 43 | 0.2 | 0.8 | 1 | 1 | 3 |
| 44 | 0.0107 | 0.9893 | 1 | 2 | 3 |
| 45 | 0.0133 | 0.9867 | 1 | 3 | 3 |
| 46 | 0.016 | 0.984 | 1 | 4 | 3 |
| 47 | 0.0187 | 0.9813 | 1 | 5 | 3 |
| 48 | 0.0213 | 0.9787 | 1 | 6 | 3 |
| 49 | 0.0107 | 0.9893 | 2 | 1 | 3 |
| 50 | 0.0133 | 0.9867 | 2 | 2 | 3 |
| 51 | 0.016 | 0.984 | 2 | 3 | 3 |
| 52 | 0.0187 | 0.9813 | 2 | 4 | 3 |
| 53 | 0.0213 | 0.9787 | 2 | 5 | 3 |
| 54 | 0.024 | 0.976 | 2 | 6 | 3 |
| 55 | 0.0133 | 0.9867 | 3 | 1 | 3 |
| 56 | 0.016 | 0.984 | 4 | 1 | 3 |
| 60 | 0.016 | 0.984 | 3 | 2 | 3 |
| 61 | 0.019 | 0.981 | 3 | 3 | 3 |
| 62 | 0.013 | 2.987 | 1 | 1 | 3 |
| 63 | 0.013 | 1.987 | 2 | 1 | 3 |
| 64 | 0.016 | 2.984 | 2 | 1 | 3 |
| 65 | 0.016 | 1.984 | 3 | 1 | 3 |
| 66 | 0.019 | 2.981 | 3 | 1 | 3 |
| 67 | 0.013 | 1.987 | 1 | 2 | 3 |
| 68 | 0.016 | 2.984 | 1 | 2 | 3 |
| 69 | 0.019 | 2.981 | 2 | 2 | 3 |
| 70 | 0.019 | 1.981 | 3 | 2 | 3 |
| 71 | 0.021 | 2.979 | 3 | 2 | 3 |
| 72 | 0.016 | 1.984 | 1 | 3 | 3 |
| 73 | 0.019 | 2.981 | 1 | 3 | 3 |
| 74 | 0.019 | 1.981 | 2 | 3 | 3 |
| 75 | 0.021 | 2.979 | 2 | 3 | 3 |
| 76 | 0.021 | 1.979 | 3 | 3 | 3 |

TABLE 13

Mixing composition of raw powder (unit: % by weight)

| Example | Si3N4 | AlN | Ca3N2 | EuN |
|---|---|---|---|---|
| 38 | 34.01 | 29.81 | 35.94 | 0.24 |
| 39 | 33.925 | 29.74 | 35.855 | 0.48 |
| 40 | 33.765 | 29.595 | 35.68 | 0.96 |
| 41 | 33.685 | 29.525 | 35.595 | 1.195 |
| 42 | 31.785 | 27.86 | 33.59 | 6.77 |
| 43 | 27.45 | 24.06 | 29.01 | 19.485 |
| 44 | 25.99 | 45.56 | 27.465 | 0.985 |
| 45 | 21.125 | 55.55 | 22.325 | 1 |
| 46 | 17.795 | 62.39 | 18.805 | 1.01 |
| 47 | 15.37 | 67.365 | 16.245 | 1.02 |
| 48 | 13.53 | 71.15 | 14.295 | 1.025 |
| 49 | 50.365 | 22.07 | 26.61 | 0.955 |
| 50 | 41.175 | 36.09 | 21.755 | 0.975 |
| 51 | 34.825 | 45.785 | 18.4 | 0.99 |
| 52 | 30.17 | 52.89 | 15.94 | 1 |
| 53 | 26.615 | 58.32 | 14.06 | 1.01 |
| 54 | 23.805 | 62.6 | 12.58 | 1.015 |
| 55 | 60.235 | 17.6 | 21.22 | 0.95 |
| 56 | 66.775 | 14.635 | 17.64 | 0.95 |
| 60 | 51.135 | 29.88 | 18.015 | 0.97 |
| 61 | 44.425 | 38.94 | 15.65 | 0.98 |
| 62 | 19.63 | 17.205 | 62.235 | 0.93 |
| 63 | 39.705 | 17.4 | 41.96 | 0.94 |

TABLE 13-continued

Mixing composition of raw powder (unit: % by weight)

| Example | Si3N4 | AlN | Ca3N2 | EuN |
|---|---|---|---|---|
| 64 | 32.765 | 14.36 | 51.94 | 0.93 |
| 65 | 49.61 | 14.495 | 34.955 | 0.94 |
| 66 | 42.175 | 12.325 | 44.57 | 0.93 |
| 67 | 20.35 | 35.675 | 43.01 | 0.965 |
| 68 | 16.72 | 29.315 | 53.015 | 0.95 |
| 69 | 28.615 | 25.08 | 45.36 | 0.95 |
| 70 | 43.27 | 25.285 | 30.485 | 0.955 |
| 71 | 37.505 | 21.915 | 39.635 | 0.945 |
| 72 | 17.24 | 45.34 | 36.44 | 0.98 |
| 73 | 14.565 | 38.295 | 46.175 | 0.965 |
| 74 | 29.37 | 38.615 | 31.04 | 0.975 |
| 75 | 25.395 | 33.39 | 40.255 | 0.96 |
| 76 | 38.37 | 33.63 | 27.03 | 0.97 |

TABLE 14

Peak wavelength of excitation and emission spectra on fluorescence measurement

| | Excitation spectrum | | Emission spectrum | |
|---|---|---|---|---|
| Example | Peak wavelength nm | Strength arbitrary unit | Peak wavelength nm | Intensity arbitrary unit |
| 38 | 449 | 8461 | 653 | 8479 |
| 39 | 449 | 7782 | 650 | 7832 |
| 40 | 449 | 8470 | 654 | 8551 |
| 41 | 449 | 9725 | 658 | 9762 |
| 42 | 449 | 6171 | 679 | 6182 |
| 43 | 449 | 1279 | 697 | 1245 |
| 44 | 449 | 7616 | 650 | 7763 |
| 45 | 449 | 7796 | 653 | 7854 |
| 46 | 449 | 6635 | 653 | 6685 |
| 47 | 449 | 6106 | 654 | 6149 |
| 48 | 449 | 5857 | 654 | 5907 |
| 49 | 333 | 5168 | 636 | 5211 |
| 50 | 332 | 4271 | 641 | 4342 |
| 51 | 330 | 4004 | 642 | 4046 |
| 52 | 335 | 3903 | 645 | 3954 |
| 53 | 335 | 3638 | 648 | 3703 |
| 54 | 337 | 3776 | 649 | 3799 |
| 55 | 316 | 2314 | 601 | 2348 |
| 56 | 407 | 1782 | 587 | 1906 |
| 60 | 412 | 4304 | 616 | 4330 |
| 61 | 409 | 4080 | 607 | 4099 |
| 62 | 467 | 3130 | 649 | 3135 |
| 63 | 322 | 2461 | 648 | 2461 |
| 64 | 449 | 1961 | 643 | 1996 |
| 65 | 316 | 3003 | 620 | 3003 |
| 66 | 319 | 3714 | 660 | 3714 |
| 67 | 449 | 4534 | 650 | 4586 |
| 68 | 467 | 3072 | 647 | 3067 |
| 69 | 449 | 6422 | 650 | 6426 |
| 70 | 449 | 7785 | 649 | 7856 |
| 71 | 449 | 4195 | 650 | 4179 |
| 72 | 449 | 4102 | 650 | 4095 |
| 73 | 461 | 2696 | 649 | 2693 |
| 74 | 449 | 9023 | 654 | 9146 |
| 75 | 450 | 5117 | 650 | 5180 |
| 76 | 322 | 6538 | 649 | 6538 |

Examples 77 to 84

As Examples 77 to 84 were prepared inorganic compounds having compositions in which D, E, and X Elements in the $EU_aCa_bD_cE_dX_e$ composition were changed.

Phosphors were prepared in the same manner as in Example 1 with the exception of the compositions shown in Tables 15 and 16. According to the measurement of X-ray diffraction, it was confirmed that the synthesized powders were powders containing inorganic compounds having the same crystal structure as that of CaAlSiN$_3$. When excitation and emission spectra of the synthesized inorganic compound were measured, as shown in Table 17, it was confirmed that they were red phosphors having an emission peak in the range of 570 nm to 700 nm, which were excited with an ultraviolet ray or a visible light of 350 nm to 600 nm.

Examples 85 to 92

As Examples 85 to 92 were prepared inorganic compounds having compositions in which M Element in the $M_aCa_bSi_cAl_d(N,O)_e$ composition were changed.

TABLE 15

Parameters for designed composition

| | M Element | A Element | D Element | | | | | E Element | | | X Element | |
|---|---|---|---|---|---|---|---|---|---|---|---|---|
| | Eu | Ca | Si | Ge | Ti | Hf | Zr | Al | Y | Sc | N | O |
| Example | a Value | b Value | c Value | | | | | d Value | | | e Value | |
| 77 | 0.008 | 0.992 | 1 | | | | | 0.95 | 0.05 | | 3 | |
| 78 | 0.008 | 0.992 | 1 | | | | | 0.9 | 0.1 | | 3 | |
| 79 | 0.008 | 0.992 | 1 | | | | | 0.8 | 0.2 | | 3 | |
| 80 | 0.008 | 0.992 | 0.95 | 0.05 | | | | 1 | | | 3 | |
| 81 | 0.008 | 0.992 | 1 | | | | | 0.97 | | 0.03 | 3 | 0.045 |
| 82 | 0.008 | 0.992 | 0.97 | | 0.03 | | | 1 | | | 3 | 0.06 |
| 83 | 0.008 | 0.992 | 0.95 | | | 0.05 | | 1 | | | 3 | 0.1 |
| 84 | 0.008 | 0.992 | 0.97 | | | | 0.03 | 1 | | | 3 | |

TABLE 16

Mixing composition of raw powder (unit: % by weight)

| | M Element | A Element | D Element | | | | | E Element | | |
|---|---|---|---|---|---|---|---|---|---|---|
| Example | EuN | Ca3N2 | Si3N4 | Ge3N4 | TiO2 | HfO2 | ZrN | AlN | YN | Sc2O3 |
| 77 | 0.95 | 34.7 | 33.1 | | | | | 27.6 | 3.65 | |
| 78 | 0.9 | 34 | 32.4 | | | | | 25.55 | 7.15 | |
| 79 | 0.9 | 32.6 | 31.1 | | | | | 21.8 | 13.7 | |
| 80 | 0.95 | 34.95 | 31.65 | 3.25 | | | | 29.2 | | |
| 81 | 0.95 | 35.3 | 33.65 | | | | | 28.6 | | 1.5 |
| 82 | 0.95 | 35.25 | 32.6 | | 1.75 | | | 29.45 | | |
| 83 | 0.9 | 33.5 | 30.35 | | | 7.2 | | 28 | | |
| 84 | 0.95 | 35 | 32.4 | | | | 2.35 | 29.3 | | |

TABLE 17

Peak wavelength and intensity of excitation and emission spectra on fluorescence measurement

| | Excitation spectrum | | Emission spectrum | |
|---|---|---|---|---|
| Example | Peak wavelength nm | Strength arbitrary unit | Peak wavelength nm | Intensity arbitrary unit |
| 77 | 449 | 6223 | 653 | 6380 |
| 78 | 449 | 4449 | 653 | 4565 |
| 79 | 449 | 3828 | 650 | 3937 |
| 80 | 449 | 2022 | 645 | 2048 |
| 81 | 449 | 5143 | 647 | 5481 |
| 82 | 450 | 2478 | 648 | 2534 |
| 83 | 449 | 3246 | 646 | 3303 |
| 84 | 449 | 8021 | 649 | 8050 |

Phosphors were prepared in the same manner as in Example 1 with the exception of the compositions shown in Tables 18 and 19. According to the measurement of X-ray diffraction, it was confirmed that the synthesized powders were powders containing inorganic compounds having the same crystal structure as that of CaAlSiN$_3$. When excitation and emission spectra of the synthesized inorganic compound were measured, as shown in Table 20, is was confirmed that they were red phosphors having an emission peak in the range of 570 nm to 700 nm other than the phosphor of Example 89, which were excited with an ultraviolet ray or a visible light of 350 nm to 600 nm. In Example 89, emission having a peak wavelength of 550 nm was observed.

TABLE 18

Parameters for designed composition

| Example | M Element Mn | Ce | Sm | Eu a Value | Tb | Dy | Er | Yb | A Element Ca b Value | D Element Si c Value | E Element Al d Value | X Element N | O e Value |
|---|---|---|---|---|---|---|---|---|---|---|---|---|---|
| 85 | 0.0027 | | | | | | | | 0.9973 | 1 | 1 | 3 | 0.0027 |
| 86 | | 0.0027 | | | | | | | 0.9973 | 1 | 1 | 3 | 0.0054 |
| 87 | | | 0.0027 | | | | | | 0.9973 | 1 | 1 | 3 | 0.0041 |
| 88 | | | | 0.0027 | | | | | 0.9973 | 1 | 1 | 3 | 0.0041 |
| 89 | | | | | 0.0027 | | | | 0.9973 | 1 | 1 | 3 | 0.0047 |
| 90 | | | | | | 0.0027 | | | 0.9973 | 1 | 1 | 3 | 0.0041 |
| 91 | | | | | | | 0.0027 | | 0.9973 | 1 | 1 | 3 | 0.0041 |
| 92 | | | | | | | | 0.0027 | 0.9973 | 1 | 1 | 3 | 0.0041 |

TABLE 19

Mixing composition of raw powder (unit: % by weight)

| Example | M Element MnCO3 | CeO2 | Sm2O3 | Eu2O3 | Tb4O7 | Dy2O3 | Er2O3 | Yb2O3 | A Element Ca3N2 | D Element Si3N4 | E Element AlN |
|---|---|---|---|---|---|---|---|---|---|---|---|
| 85 | 0.22 | | | | | | | | 35.95 | 34.01 | 29.82 |
| 86 | | 0.33 | | | | | | | 35.91 | 33.97 | 29.78 |
| 87 | | | 0.34 | | | | | | 35.91 | 33.97 | 29.78 |
| 88 | | | | 0.341 | | | | | 35.91 | 33.97 | 29.78 |
| 89 | | | | | 0.36 | | | | 35.9 | 33.96 | 29.77 |
| 90 | | | | | | 0.36 | | | 35.9 | 33.97 | 29.78 |
| 91 | | | | | | | 0.37 | | 35.9 | 33.96 | 29.77 |
| 92 | | | | | | | | 0.38 | 35.89 | 33.96 | 29.77 |

TABLE 20

Peak wavelength and intensity of excitation and emission spectra on fluorescence measurement

| | Excitation spectrum | | Emission spectrum | |
|---|---|---|---|---|
| Example | Peak wavelength nm | Strength arbitrary unit | Peak wavelength nm | Intensity arbitrary unit |
| 85 | 449 | 1629 | 631 | 1703 |
| 86 | 466 | 2453 | 616 | 2592 |
| 87 | 310 | 3344 | 651 | 3344 |
| 88 | 449 | 6933 | 641 | 7032 |
| 89 | 255 | 2550 | 550 | 2550 |
| 90 | 248 | 7459 | 580 | 7509 |
| 91 | 449 | 1572 | 631 | 1630 |
| 92 | 448 | 821 | 640 | 833 |

Example 101

As raw powders were used an $Eu_2O_3$ powder, a $Ca_3N_2$ powder having an oxygen content of 9% by mol which is represented by mol number of oxygen relative to the total mol number of nitrogen and oxygen, an $Si_3N_4$ powder having an oxygen content as above of 2% by mol, and an AlN powder having an oxygen content as above of 2% by mol. Respective powders were weighed so as to be the metal element composition ratio (mol ratio) of Eu:Ca:Al:Si=0.008:0.992:1:1 and mixed to obtain a raw mixed powder. The oxygen content represented by mol number of oxygen relative to the total mol number of nitrogen and oxygen in the raw mixed powder was 5% by mol. In this connection, the $Ca_3N_2$ powder is a powder obtained by allowing oxygen to exist using raw materials to be baked containing only a desired concentration of oxygen, the $Si_3N_4$ powder is a powder obtained by allowing oxygen to exist using raw materials to be baked containing only a desired concentration of oxygen, the AlN powder is a powder obtained by allowing oxygen to exist using raw materials to be baked containing only a desired concentration of oxygen.

The raw mixed powder was placed in a crucible made of boron nitride without compression so as to be a bulk density of 0.35 g/cm$^3$ and was baked at 1600° C. for 10 hours in a highly pure nitrogen atmosphere containing an oxygen concentration of 10 ppm or less at a nitrogen pressure of 1.1 atm using an electric furnace. At this time, the oxygen existing ratio in the raw material at baking is 5% by mol based on the calculation from the oxygen concentration in each raw material and the mixing ratio of each raw material.

As a result of identification of the crystal phase formed in the resulting phosphor by powder X-ray diffraction method, it was confirmed that $CaAlSiN_3$ family crystal phase was formed. When fluorescence properties of the phosphor were measured by excitation with a wavelength of 465 nm using a fluorescence spectrophotometer, the resulting phosphor showed a peak intensity of 128 in the case that the peak intensity of a commercially available yttrium aluminum garnet-based phosphor activated with Ce was regarded as 100, showing a high emission intensity, and a red light having a peak wavelength of 652 nm was observed. Moreover, 20 mg of the obtained phosphor sample was charged into a tin capsule, which was then placed in a nickel basket. Then, when the concentrations of oxygen and nitrogen in the powder sample were analyzed using a TC-436 Model oxygen and nitrogen analyzer manufactured by LECO, in the total of nitrogen and oxygen, it contained 94% by mol of nitrogen and 6% by mol of oxygen.

Example 102

A phosphor powder was obtained in the same manner as in Example 101 except that EuF$_3$ was used instead of Eu$_2$O$_3$. The oxygen content represented by mol number of oxygen relative to the total mol number of nitrogen and oxygen in the raw mixed powder was 5% by mol. Moreover, the oxygen existing ratio in the raw material at baking is 5% by mol based on the calculation from the oxygen concentration in each raw material and the mixing ratio of each raw material.

As a result of identification of the crystal phase formed in the resulting phosphor by powder X-ray diffraction method, it was confirmed that CaAlSiN$_3$ family crystal phase was formed. When fluorescence properties of the phosphor were measured by excitation with a wavelength of 465 nm using a fluorescence spectrophotometer, the resulting phosphor showed a peak intensity of 114 in the case that the peak intensity of a commercially available yttrium aluminum garnet-based phosphor activated with Ce was regarded as 100, showing a high emission intensity, and a red light having a peak wavelength of 650 nm was observed. Moreover, 20 mg of the obtained phosphor sample was charged into a tin capsule, which was then placed in a nickel basket. Then, when the concentrations of oxygen and nitrogen in the powder sample were analyzed using a TC-436 Mode: oxygen and nitrogen analyzer manufactured by LECO, in the total of nitrogen and oxygen, it contained 95% by mol of nitrogen and 5% by mol of oxygen.

Example 103

A phosphor powder was obtained in the same manner as in Example 101 except that EuN was used instead of Eu$_2$O$_3$ and the baking time was changed to 2 hours. The oxygen content represented by mol number of oxygen relative to the total mol number of nitrogen and oxygen in the raw mixed powder was 5% by mol. Moreover, the oxygen existing ratio in the raw material at baking is 5% by mol based on the calculation from the oxygen concentration in each raw material and the mixing ratio of each raw material.

As a result of identification of the crystal phase formed in the resulting phosphor by powder X-ray diffraction method, it was confirmed that CaAlSiN$_3$ family crystal phase was formed. When fluorescence properties of the phosphor were measured by excitation with a wavelength of 465 nm using a fluorescence spectrophotometer, the resulting phosphor showed a peak intensity of 112 in the case that the peak intensity of a commercially available yttrium aluminum garnet-based phosphor activated with Ce was regarded as 100, showing a high emission intensity, and a red light having a peak wavelength of 649 nm was observed. Moreover, 20 mg of the obtained phosphor sample was charged into a tin capsule, which was then placed in a nickel basket. Then, when the concentrations of oxygen and nitrogen in the powder sample were analyzed using a TC-436 Model oxygen and nitrogen analyzer manufactured by LECO, in the total of nitrogen and oxygen, it contained 95% by mol of nitrogen and 5% by mol of oxygen.

Example 104

A phosphor powder was obtained in the same manner as in Example 101 except that EuN was used instead of Eu$_2$O$_3$, the nitrogen pressure was changed to 10 atm, and the baking time was changed to 2 hours. The oxygen content represented by mol number of oxygen relative to the total mol number of nitrogen and oxygen in the raw mixed powder was 5% by mol. Moreover, the oxygen existing ratio in the raw material at baking is 5% by mol based on the calculation from the oxygen concentration in each raw material and the mixing ratio of each raw material.

As a result of identification of the crystal phase formed in the resulting phosphor by powder X-ray diffraction method, it was confirmed that CaAlSiN$_3$ family crystal phase was formed. When fluorescence properties of the phosphor were measured by excitation with a wavelength of 465 nm using a fluorescence spectrophotometer, the resulting phosphor showed a peak intensity of 109 in the case that the peak intensity of a commercially available yttrium aluminum garnet-based phosphor activated with Ce was regarded as 100, showing a high emission intensity, and a red light having a peak wavelength of 650 nm was observed. Moreover, 20 mg of the obtained phosphor sample was charged into a tin capsule, which was then placed in a nickel basket. Then, when the concentrations of oxygen and nitrogen in the powder sample were analyzed using a TC-436 Model oxygen and nitrogen analyzer manufactured by LECO, in the total of nitrogen and oxygen, it contained 95% by mol of nitrogen and 5% by mol of oxygen.

The results of Examples 101 to 104 are summarized in Table A.

TABLE A

| | Mixing ratio of raw materials (molar ratio) | | | | Baking conditions | | | | | | Fluorescence properties (465 nm excitation) | |
|---|---|---|---|---|---|---|---|---|---|---|---|---|
| | Eu | Ca | Al | Si | Bulk density [g/cm$^3$] | Temperature [°C.] | Time [hour] | Pressure [atm] | Oxygen existing ratio in raw material [% by mol] | Eu raw material | Peak Intensity [relative value] | Peak wavelength [nm] |
| Example 101 | 0.008 | 0.992 | 1 | 1 | 0.35 | 1600 | 10 | 1.1 | 5 | Eu$_2$O$_3$ | 128 | 652 |
| Example 102 | 0.008 | 0.992 | 1 | 1 | 0.35 | 1600 | 10 | 1.1 | 5 | EuF$_3$ | 114 | 650 |
| Example 103 | 0.008 | 0.992 | 1 | 1 | 0.35 | 1600 | 2 | 1.1 | 5 | EuN | 112 | 649 |

Figure 14:
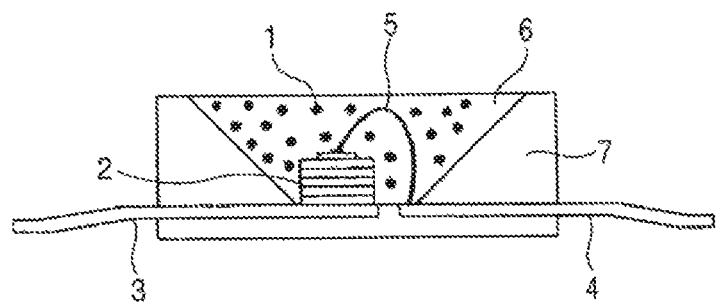
FIG. 14 is a schematic drawing of the lighting equipment (LED lighting equipment) according to the invention.

The following will explain the lighting equipment using a phosphor comprising the nitride of the invention. FIG. 14 shows a schematic structural drawing of a white LED as a lighting equipment. Using a blue LED 2 of 450 nm as a light-emitting element, the phosphor of Example 1 of the invention and a yellow phosphor of Ca-α-sialon:Eu having a composition of Ca$_{0.75}$EU$_{0.25}$Si$_{8.625}$Al$_{3.375}$O$_{1.125}$N14.875 are dispersed in a resin layer to form a structure where the blue LED 2 is covered with the resulting resin layer. When electric current is passed through the electroconductive terminals, the LED 2 emits a light of 450 nm and the yellow phosphor and the red phosphor are excited with the light to emit yellow and red lights, whereby the light of LED and the yellow and red lights are mixed to function as a lighting equipment emitting a lamp-colored light.

A lighting equipment prepared by a combination design different from the above combination may be shown. First, using an ultraviolet LED of 380 nm as a light-emitting element, the phosphor of Example 1 of the invention, a blue phosphor ($BaMgAl_{10}O_{17}$:Eu), and a green phosphor ($BaMgAl_{10}O_{17}$:Eu,Mn) are dispersed in a resin layer to form a structure where the ultraviolet LED is covered with the resulting resin layer. When electric current is passed through the electroconductive terminals, the LED emits a light of 380 nm and the red phosphor, the green phosphor, and the blue phosphor are excited with the light to emit red, green, and blue lights, whereby these lights are mixed to function as a lighting equipment emitting a white light.

A lighting equipment prepared by a combination design different from the above combination may be shown. First, using a blue LED of 450 nm as a light-emitting element, the phosphor of Example 1 of the invention and a green phosphor ($BaMgAl_{10}O_{17}$:Eu,Mn) are dispersed in a resin layer to form a structure where the blue LED is covered with the resulting resin layer. When electric current is passed through the electroconductive terminals, the LED emits a light of 450 nm and the red phosphor and the green phosphor are excited with the light to emit red and green lights, whereby the blue light of LED and the green and red lights are mixed to function as a lighting equipment emitting a white light.

Figure 15:
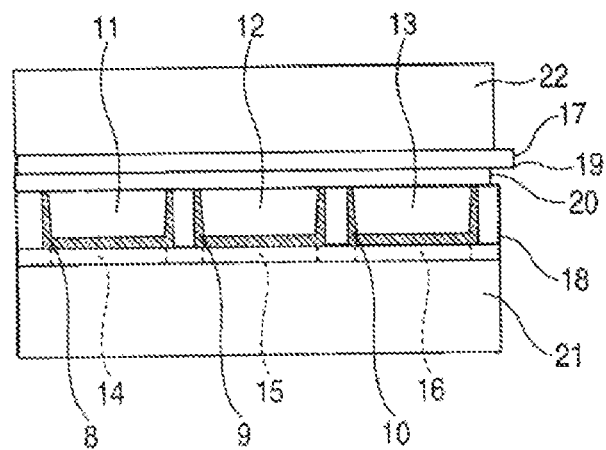
FIG. 15 is a schematic drawing of the image display unit (plasma display panel) according to the invention.

The following will explain a design example of an image display unit using the phosphor of the invention. FIG. 15 is a principle schematic drawing of a plasma display panel as an image display unit. The red phosphor of Example 1 of the invention, a green phosphor ($Zn_2SiO_4$:Mn), and a blue phosphor ($BaMgAl_{10}O_{17}$:Eu) are applied on the inner surface of cells 11, 12, and 13, respectively. When electric current is passed through electrodes 14, 15, 16, and 17, a vacuum ultraviolet ray is generated in the cells by Xe discharge and thereby the phosphors are excited to emit red, green, and blue visible lights. The lights are observed from the outside through the protective layer 20, the dielectric layer 19, and the glass substrate 22, whereby the unit functions as an image display.

While the invention has been described in detail and with reference to specific embodiments thereof, it will be apparent to one skilled in the art that various changes and modifications can be made therein without departing from the spirit and scope thereof.

The present application is based on Japanese Patent Application No. 2003-394855 filed on Nov. 26, 2003, Japanese Patent Application No. 2004-41503 filed on Feb. 18, 2004, Japanese Patent Application No. 2004-154548 filed on May 25, 2004, and Japanese Patent Application No. 2004-159306 filed on May 28, 2004; and the contents are incorporated herein by reference.

INDUSTRIAL APPLICABILITY

The nitride phosphor of the invention exhibits emission at a longer wavelength as compared with conventional sialon and oxynitride phosphors and is excellent as a red phosphor. Furthermore, since luminance decrease of the phosphor is small when it is exposed to an excitation source, it is a nitride phosphor suitably used for VFD, FED, PDP, CRT, white LED, and the like. Hereafter, it is expected that the phosphor is widely utilized in material design in various display units and thus contributes development of industry.

The invention claimed is:

1. A phosphor comprising an inorganic compound represented by the composition formula:

$$M_a A_b D_c E_d X_e$$

wherein:

M is one or two or more elements selected from the group consisting of Mn, Ce, Pr, Nd, Sm, Eu, Tb, Dy, Ho, Er, Tm, and Yb;

A is one or two or more elements selected from the group consisting of divalent metal elements other than M Element;

D is one or two or more elements selected from the group consisting of tetravalent metal elements;

E is one or two or more elements selected from the group consisting of trivalent metal elements;

X is one or two or more elements selected from the group consisting of O, N, and F;

$a+b=1$;

$0.00001 \leq a \leq 0.1$;

$0.5 \leq c \leq 1.8$;

$0.5 \leq d \leq 1.8$;

$0.8 \times (2/3 + 4/3 \times c + d) \leq e$;

$e \leq 1.2 \times (2/3 + 4/3 \times c + d)$.

2. The phosphor of claim 1, wherein the inorganic compound has the same crystal structure as $CaAlSiN_3$ or a crystal structure such that:

positions of skeletal atoms in the inorganic compound are not sufficiently different from skeletal atoms in $CaAlSiN_3$ that corresponding chemical bonds are cleaved; and lengths of chemical bonds in the inorganic compound corresponding to Al—N and Si—N bonds in $CaAlSiN_3$ differ from lengths of Al—N and Si—N bonds in $CaAlSiN_3$ by +15%.

3. The phosphor of claim 1, wherein the inorganic compound comprises $CaAlSiN_3$:Eu.

4. The phosphor according to claim 1, wherein:

A is one or two or more elements selected from the group consisting of Mg, Ca, Sr, and Ba;

D is one or two or more elements selected from the group consisting of Si, Ge, Sn, Ti, Zr, and Hf; and E is one or two or more elements selected from the group consisting of B, Al, Ga, In, Sc, Y, La, Gd, and Lu.

5. The phosphor according to claim 1, wherein:

M comprises Eu;

A comprises Ca;

D comprises Si;

E comprises Al; and

X comprises N.

6. The phosphor according to claim 1, wherein the inorganic compound is a $CaAlSiN_3$ crystal phase or a solid solution of a $CaAlSiN_3$ crystal phase.

7. The phosphor according to claim 1, wherein:

M comprises Eu;

A comprises Ca;

D comprises Si;

E comprises Al; and

X comprises a mixture of N and O.

8. The phosphor according to claim 1, wherein A comprises Sr.

9. The phosphor according to claim 8, wherein numbers of atoms of Ca and Sr in the inorganic compound satisfy:

$$0.02 \leq (\text{number of atoms of Ca})/\{(\text{number of atoms of Ca})+(\text{number of atoms of Sr})\} < 1.$$

10. The phosphor according to claim 1, wherein X comprises N and O.

11. The phosphor according to claim 10, wherein numbers of atoms of O and N in the inorganic compound satisfy:

$$0.5 \leq (\text{number of atoms of N})/\{(\text{number of atoms of N})+(\text{number of atoms of O})\} \leq 1.$$

12. The phosphor according to claim 10, wherein the inorganic compound is represented by:

$$M_a A_b D_{1-x} E_{1+x} N_{3-x} O_x$$

wherein:
a+b=1; and
0<x≦0.5.

13. The phosphor according to claim 1, wherein:
the inorganic compound is in the form of a powder;
the powder has an average particle size of 0.1 μm to 20 μm; and
the powder comprises single crystal particles or aggregates of single crystals.

14. The phosphor according to claim 1, wherein the inorganic compound comprises impurity elements of Fe, Co, and Ni in an amount of 50 ppm or less.

15. The phosphor according to claim 1, comprising the inorganic compound and a further crystal phase or amorphous phase;
wherein the inorganic compound is present in an amount of at least 20% by weight based on a total weight of the inorganic compound and the further crystal phase or amorphous phase.

16. The phosphor according to claim 15, wherein the further crystal phase or amorphous phase comprises an inorganic substance having electroconductivity.

17. The phosphor according to claim 16, wherein the inorganic substance having electroconductivity is a material comprising an oxide, oxynitride, or nitride comprising one or two or more elements selected from the group consisting of Zn, Al, Ga, In, and Sn.

18. The phosphor according to claim 15, wherein the further crystal phase or amorphous phase differs in composition from the inorganic compound.

19. The phosphor according to claim 1, wherein the phosphor emits a fluorescent light having a peak wavelength of from 570 nm to 700 nm, when irradiated with an excitation source.

20. The phosphor according to claim 19, wherein the excitation source is an ultraviolet ray or visible light having a wavelength of 100 nm to 600 nm.

21. The phosphor according to claim 19, wherein:
the inorganic compound is a $CaAlSiN_3$ crystal phase;
Eu is dissolved in the crystal phase; and
the phosphor emits a fluorescent light having a peak wavelength of from 600 nm to 700 nm, when irradiated with light having a wavelength of from 100 nm to 600 nm.

22. The phosphor according to claim 19, wherein the excitation source is an electron beam or an X-ray.

23. The phosphor according to claim 19, wherein the phosphor emits fluorescent light having a color satisfying:

$$0.45 \leq x \leq 0.7$$

as a value of (x, y) on the CIE coordinates.

* * * * *